(12) United States Patent
Miyairi et al.

(10) Patent No.: US 7,524,713 B2
(45) Date of Patent: Apr. 28, 2009

(54) MANUFACTURING METHOD OF SEMICONDUCTOR DEVICE

(75) Inventors: Hidekazu Miyairi, Isehara (JP); Chiho Kokubo, Tochigi (JP); Koki Inoue, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 179 days.

(21) Appl. No.: 11/588,331

(22) Filed: Oct. 27, 2006

(65) Prior Publication Data

US 2007/0105288 A1    May 10, 2007

(30) Foreign Application Priority Data

Nov. 9, 2005    (JP)    ............................. 2005-324359

(51) Int. Cl.
*H01L 21/00*    (2006.01)
(52) U.S. Cl. ............... 438/166; 438/471; 257/E21.133; 257/E21.134; 257/E21.318
(58) Field of Classification Search ................. 438/166, 438/471; 257/E21.133, E21.134, E21.318
See application file for complete search history.

(56) References Cited

U.S. PATENT DOCUMENTS

| | | | |
|---|---|---|---|
| 5,244,819 A | 9/1993 | Yue | |
| 5,352,291 A | 10/1994 | Zhang et al. | |
| 5,529,937 A | 6/1996 | Zhang et al. | |
| 5,578,520 A | 11/1996 | Zhang et al. | |
| 5,643,826 A | 7/1997 | Ohtani et al. | |
| 5,789,284 A | 8/1998 | Yamazaki et al. | |
| 5,861,337 A | 1/1999 | Zhang et al. | |
| 5,960,323 A | 9/1999 | Wakita et al. | |
| 6,027,960 A | 2/2000 | Kusumoto et al. | |

(Continued)

FOREIGN PATENT DOCUMENTS

JP    07-183540    7/1995

(Continued)

OTHER PUBLICATIONS

Suga et al., "P-3: The Effect of Laser Annealing Ambient on the Morphology and TFT Performance of Poly-Si Films," Sid International Symposium Digest of Technical Papers, SID '00 Digest, 2000, pp. 534-537.

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

A manufacturing method of a semiconductor device with improved operating characteristics and reliability is provided. An amorphous semiconductor film is formed over a substrate, doped with a metal element promoting crystallization, and crystallized by first heat treatment to form a crystalline semiconductor film; a first oxide film formed over the crystalline semiconductor film is removed and a second oxide film is formed; the crystalline semiconductor film having the second oxide film formed thereover is irradiated with first laser light; a semiconductor film containing a rare gas element is formed over the second oxide film; the metal element contained in the crystalline semiconductor film is gettered to the semiconductor film containing a rare gas element by second heat treatment; the semiconductor film containing a rare gas element and the second oxide film are removed; and the crystalline semiconductor film is irradiated with second laser light in an atmosphere containing oxygen.

52 Claims, 23 Drawing Sheets

U.S. PATENT DOCUMENTS

| | | |
|---|---|---|
| 6,048,588 A | 4/2000 | Engelsberg |
| 6,072,194 A | 6/2000 | Wakita et al. |
| 6,096,581 A | 8/2000 | Zhang et al. |
| 6,162,667 A | 12/2000 | Funai et al. |
| 6,242,292 B1 | 6/2001 | Yamazaki et al. |
| 6,300,176 B1 | 10/2001 | Zhang et al. |
| 6,348,369 B1 | 2/2002 | Kusumoto et al. |
| 6,436,745 B1 | 8/2002 | Gotou et al. |
| 6,559,036 B1 | 5/2003 | Ohtani et al. |
| 6,677,222 B1 | 1/2004 | Mishima et al. |
| 6,706,568 B2 | 3/2004 | Nakajima |
| 6,855,584 B2 | 2/2005 | Yamazaki et al. |
| 6,906,344 B2 | 6/2005 | Yamazaki et al. |
| 7,015,083 B2 | 3/2006 | Yamazaki et al. |
| 2006/0183276 A1 | 8/2006 | Yamazaki et al. |

FOREIGN PATENT DOCUMENTS

| | | |
|---|---|---|
| JP | 08-078329 | 3/1996 |
| JP | 2001-060551 | 3/2001 |
| JP | 2003-068642 | 3/2003 |
| JP | 2005-327865 | 11/2005 |

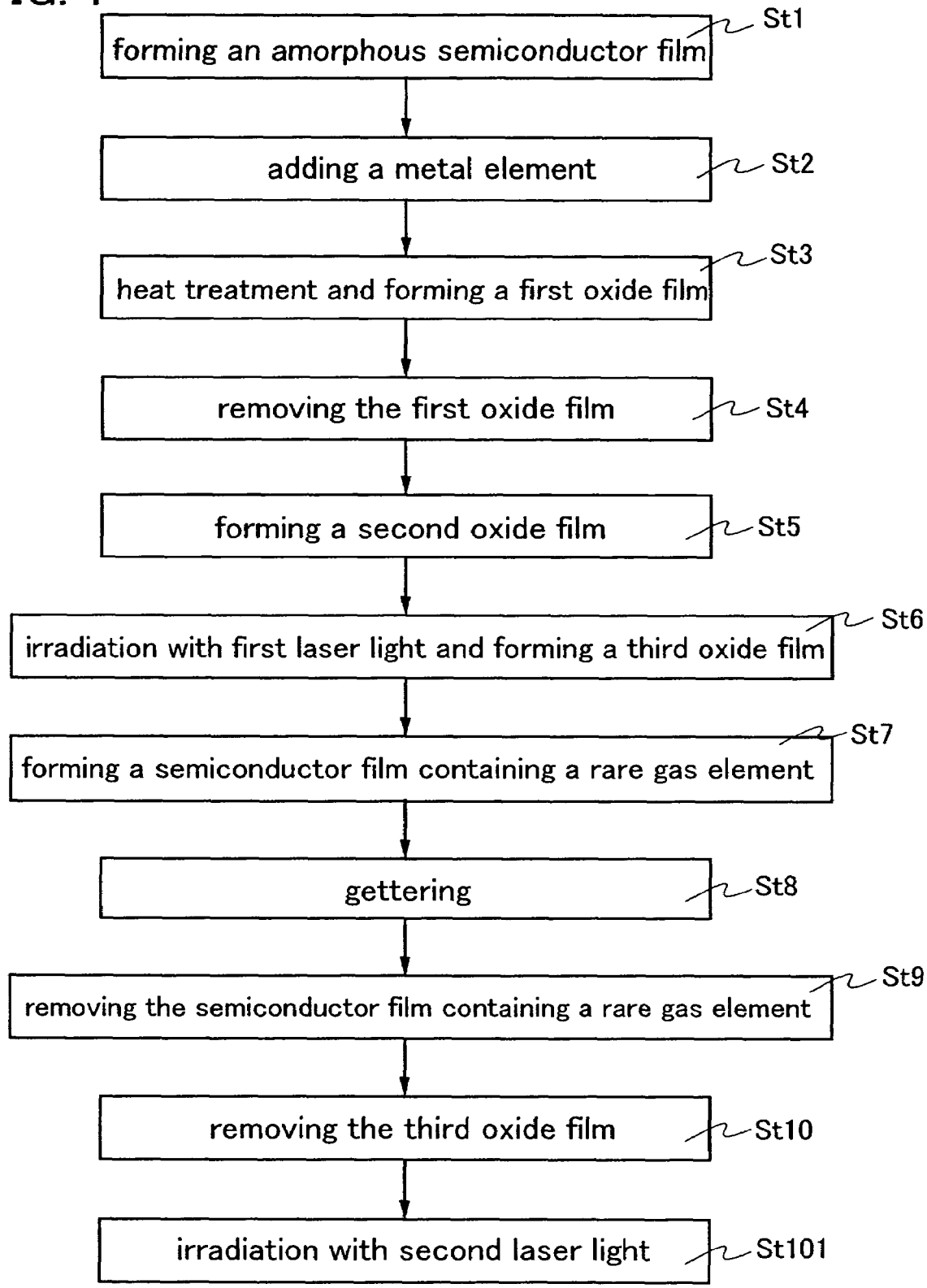

irradiation with first laser light

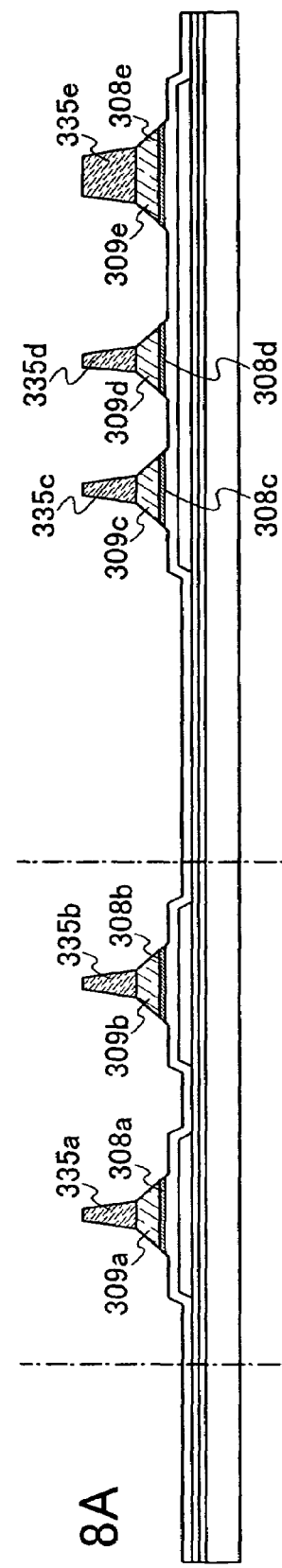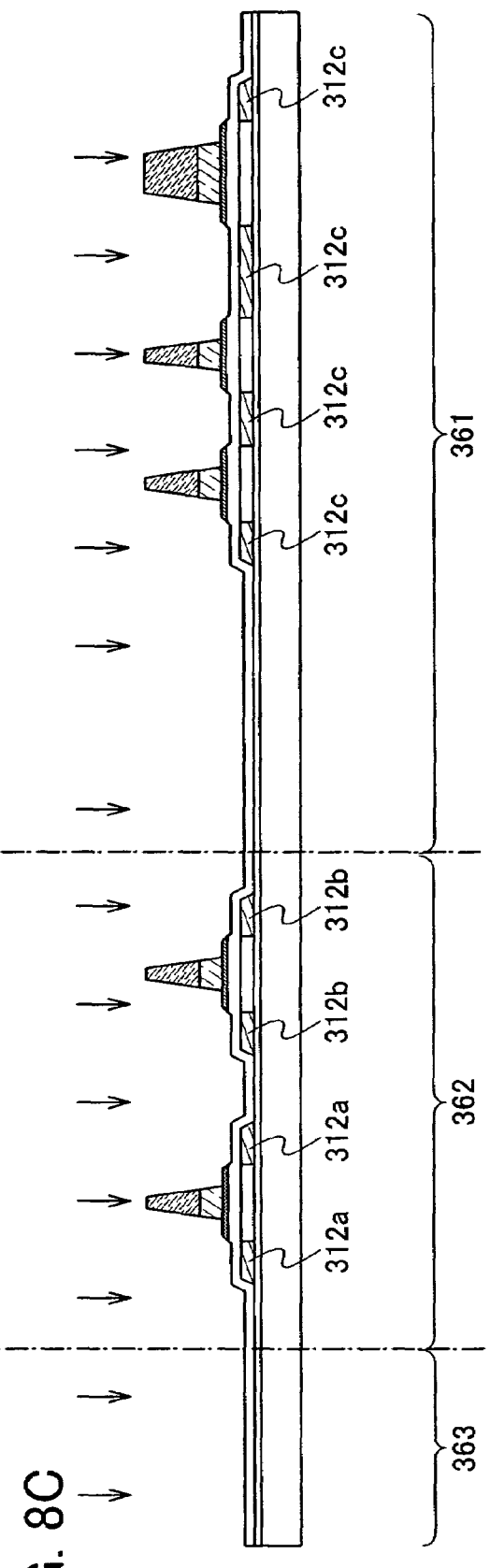

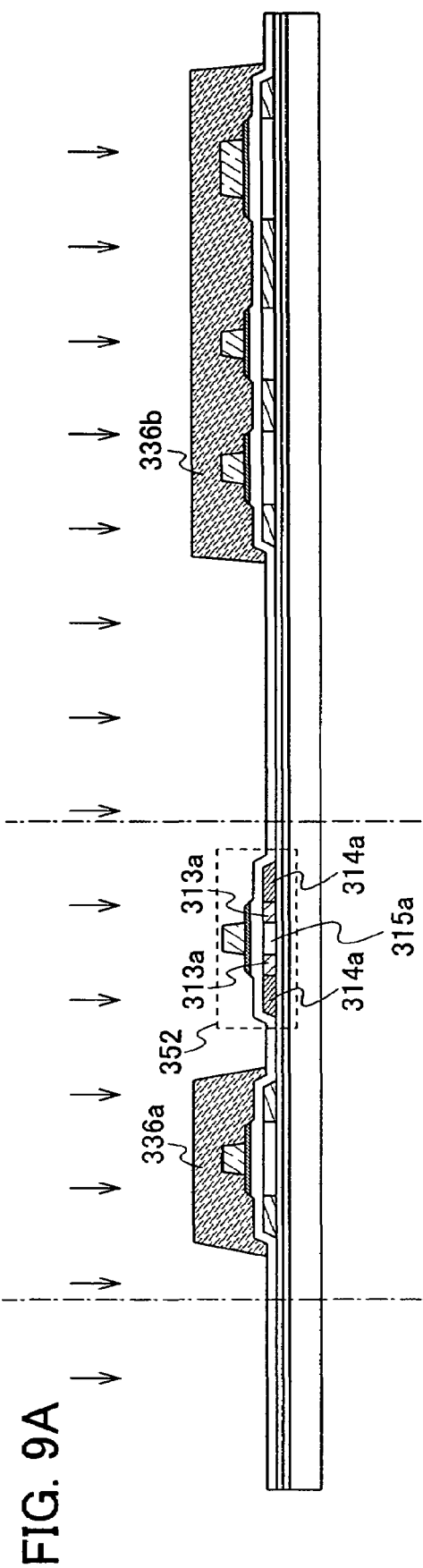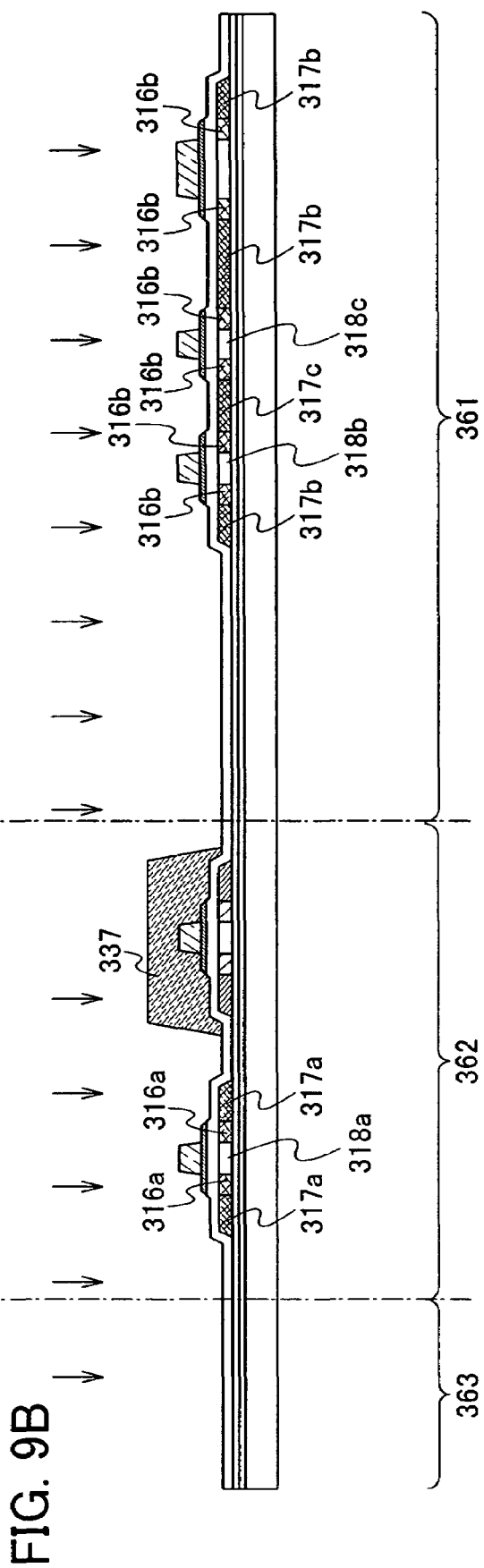

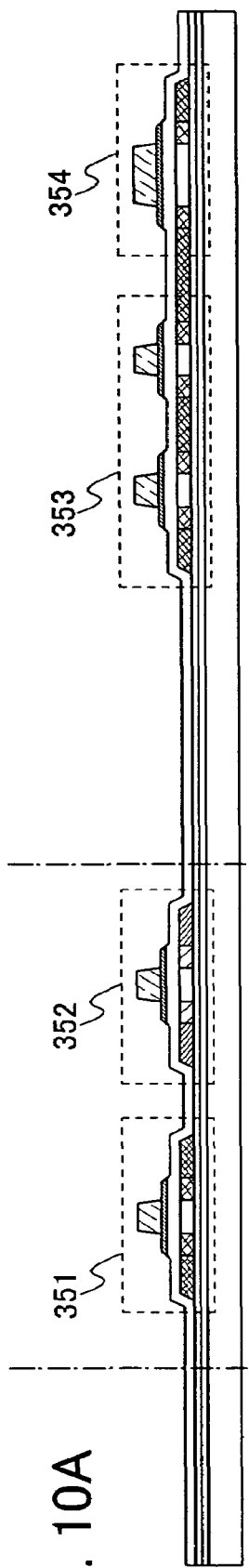
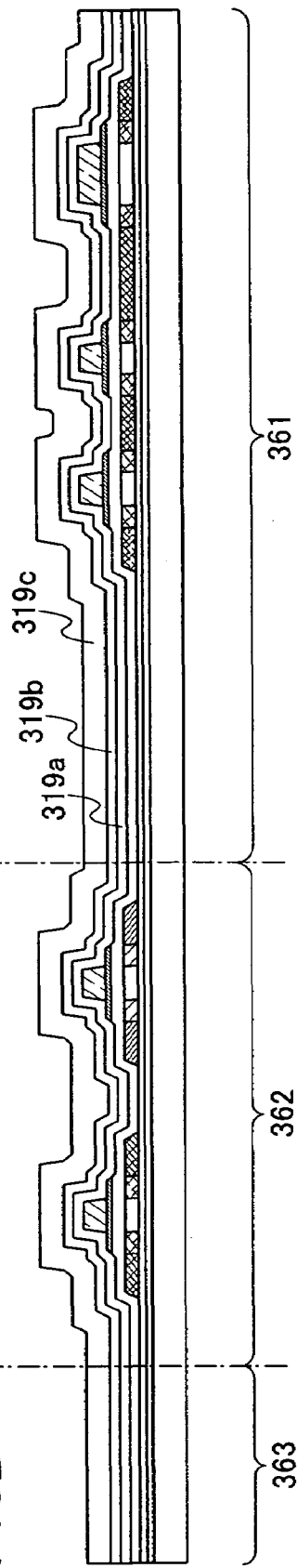
FIG. 10A
FIG. 10B

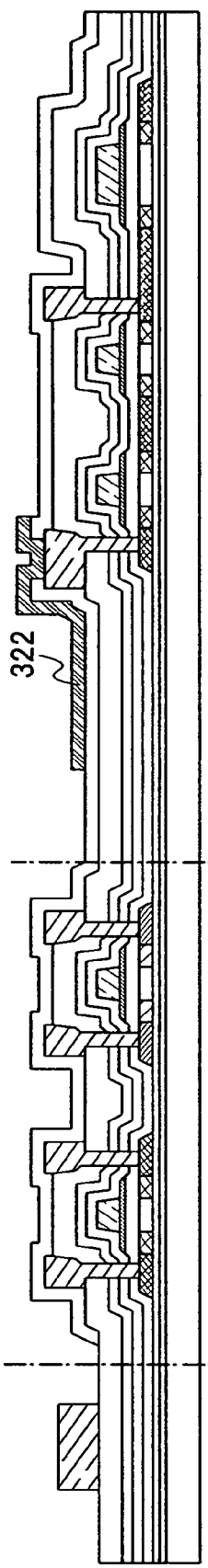
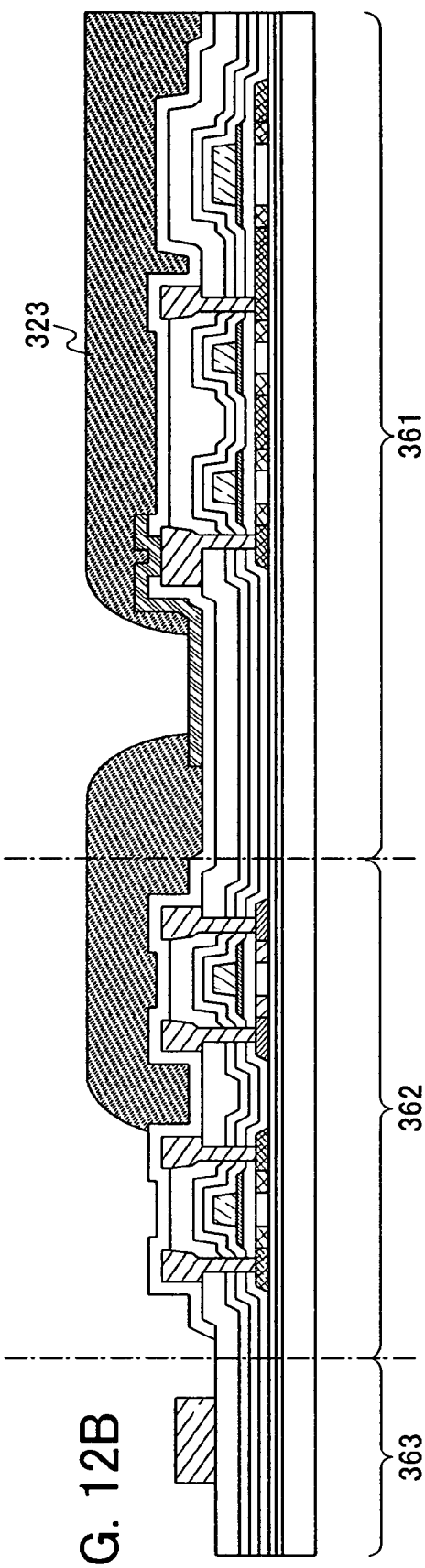

MANUFACTURING METHOD OF SEMICONDUCTOR DEVICE

BACKGROUND OF THE INVENTION

1. Field of the Invention

The present invention relates to a semiconductor device and a manufacturing of the semiconductor device. In addition, the present invention relates to a display device provided with the semiconductor device of the present invention, and an electronic device provided with the display device.

It is to be noted that, in this specification, a semiconductor device indicates all devices which can function by utilizing semiconductor characteristics.

2. Description of the Related Art

In recent years, a technique of making a thin film transistor (TFT) by using a thin semiconductor film (a thickness is approximately several to several hundreds nm) formed over a substrate having an insulating surface has been attracting attention. The transistor is widely applied to electronic devices such as an IC, an electro-optical device, and a light-emitting display device, and development thereof as a switching element for an image display device has been particularly expected.

In addition, an active matrix display device (a light-emitting display device or a liquid crystal display device), in which a switching element formed using a transistor is provided in each of display pixels arranged in a matrix, has been actively developed. In order to improve image quality of a display device, a switching element capable of operating with high-speed is required; however, there is a limitation to develop such a switching element with a transistor using an amorphous semiconductor film. Therefore, a transistor using a crystalline semiconductor film having higher field-effect mobility is used, and it is necessary to form a crystalline semiconductor film with favorable quality.

In Patent Document 1 (Japanese Published Patent Application No. 2003-68642), there is disclosed a technique in which a catalyst element which promotes crystallization such as nickel is added, an amorphous semiconductor film is crystallized by heat treatment, an obtained crystalline semiconductor film is irradiated with laser light, and crystallinity of the crystalline semiconductor film is enhanced. Further, there is disclosed a technique in which, after crystallization, the catalyst element left in the crystalline semiconductor film is gettered to an amorphous semiconductor film containing phosphorus or a rare gas element.

However, in the technique disclosed in Patent Document 1, a measure against pin holes or unevenness generated in the crystalline semiconductor film after gettering is not sufficient.

When an amorphous semiconductor film is crystallized by adding a metal element such as nickel and carrying out heat treatment, an oxide film is formed over a surface of a crystalline semiconductor film that is formed. In a case where the oxide film is removed by using a hydrofluoric acid based solution, steps of hydrofluoric acid treatment, cleaning with pure water, and drying are sequentially carried out. However, when the steps from hydrofluoric acid treatment to drying are sequentially carried out as described above, the exposed semiconductor film, oxygen in atmospheric air, and $H_2O$ molecules in pure water react with one another when removing the oxide film with hydrofluoric acid and cleaning with pure water. Therefore, a reaction product is generated over the crystalline semiconductor film. In general, this reaction product is referred to as a watermark.

In a case of manufacturing a semiconductor device, a metal element such as nickel has a function of promoting crystallization. However, when the metal element is left in a semiconductor film after crystallization, characteristics of the semiconductor device are adversely affected; therefore, the metal element is required to be removed. As one method for removing the metal element, as described in Patent Document 1, there is known a technique in which an oxide film and a semiconductor film containing a rare gas element are stacked over a crystalline semiconductor film, and a metal element is gettered from the crystalline semiconductor film to the semiconductor film containing a rare gas element by heat treatment. It is to be noted that, in gettering, a metal element contained in a region to be gettered (a semiconductor film after crystallization) is discharged by thermal energy and moves to a gettering region (a semiconductor film containing a rare gas element) by diffusion.

After reducing or removing the metal element from the crystalline semiconductor film, the oxide film and the semiconductor film containing a rare gas element over the crystalline semiconductor film are removed. Specifically, the semiconductor film containing a rare gas element is removed by etching selectively by using an alkaline solution such as tetramethylammonium hydroxide (TMAH) or choline (an aqueous solution of 2-hydroxyethyltrimethylammonium hydroxide). At this time, the reaction product, which is generated in removing the oxide film after the crystallization, is also etched, and pin holes are generated in the crystalline semiconductor film.

In addition, there are various factors to cause pin holes. When pin holes are generated in a crystalline semiconductor film, characteristics of a semiconductor device are adversely affected; for example, coverage of a gate insulating film that is formed later becomes worse and a defect is caused, and the like. Accordingly, it is a highly important object to reduce pin holes in a crystalline semiconductor film that is finally obtained and planarize the crystalline semiconductor film.

SUMMARY OF THE INVENTION

In view of the above conditions, the present invention is made, and it is an object of the present invention to provide a semiconductor device with improved operating characteristics and reliability, and a manufacturing method of the semiconductor device.

In particular, it is an object of the present invention to provide a manufacturing method of a semiconductor device in which the number of pin holes over a surface of a crystalline semiconductor film can be reduced.

As a result of diligent studies, the present inventors found that pin holes can be reduced by the following process: A metal element which promotes crystallization is added to an amorphous semiconductor film, crystallization is carried out by heat treatment, an oxide film formed over a crystalline semiconductor film is removed with hydrofluoric acid, and an oxide film is formed over the crystalline semiconductor film with ozone-containing water or the like before cleaning with pure water and drying.

In addition, the present inventors found that pin holes in a crystalline semiconductor film can be further reduced by the following process: the semiconductor film, which is crystallized by adding a metal element and by carrying out heat treatment, is irradiated with first laser light to further enhance crystallinity, the metal element is gettered by using a semiconductor film containing a rare gas element, the semiconductor film containing a rare gas element is removed, and the crystalline semiconductor film in which the metal element is reduced or removed is irradiated with second laser light.

Therefore, the present invention has a feature that an amorphous semiconductor film is formed over an insulating surface; a metal element which promotes crystallization is added to the amorphous semiconductor film; a crystalline semiconductor film is formed by crystallizing the amorphous semiconductor film by heat treatment; an oxide film which is formed in the crystallization is removed and a new oxide film is formed immediately thereafter; the crystalline semiconductor film is irradiated with first laser light to enhance crystallinity; a semiconductor film containing a rare gas element is formed over the oxide film over the crystalline semiconductor film; the metal element contained in the crystalline semiconductor film is gettered; the semiconductor film containing a rare gas element and the oxide film are removed; and the crystalline semiconductor film is irradiated with second laser light to reduce pin holes.

According to one feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment and forming a second oxide film immediately thereafter; irradiating the crystalline semiconductor film over which the second oxide film is formed with first laser light; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; and irradiating the crystalline semiconductor film with second laser light in an air atmosphere or an oxygen atmosphere.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment with a hydrofluoric acid based solution and forming a second oxide film immediately thereafter with an ozone-containing aqueous solution; irradiating the crystalline semiconductor film over which the second oxide film is formed with first laser light; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; and irradiating the crystalline semiconductor film with second laser light.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment and forming a second oxide film immediately thereafter; irradiating the crystalline semiconductor film over which the second oxide film is formed with first laser light in an air atmosphere or an oxygen atmosphere; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; and irradiating the crystalline semiconductor film with second laser light in an nitrogen atmosphere or in vacuum.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment with a hydrofluoric acid based solution and forming a second oxide film immediately thereafter with an ozone-containing aqueous solution; irradiating the crystalline semiconductor film over which the second oxide film is formed with first laser light in an air atmosphere or an oxygen atmosphere; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; and irradiating the crystalline semiconductor film with second laser light in a nitrogen atmosphere or in vacuum.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment and forming a second oxide film immediately thereafter; irradiating the crystalline semiconductor film over which the second oxide film is formed with first laser light; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; irradiating the crystalline semiconductor film with second laser light; forming an island-shaped semiconductor film by etching the crystalline semiconductor film; and forming a gate insulating film over the island-shaped semiconductor film.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment with a hydrofluoric acid based solution and forming a second oxide film immediately thereafter with an ozone-containing aqueous solution; irradiating the crystalline semiconductor film over which the second oxide film is formed with first laser light; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; irradiating the crystalline semiconductor film with second laser light; forming an island-shaped semiconductor film by etching the crystalline semiconductor film; and forming a gate insulating film over the island-shaped semiconductor film.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment and forming a second oxide film immediately thereafter; irradiating the crystalline semiconductor film over which the second oxide film is formed with first laser light in an air atmosphere or an oxygen atmosphere; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; irradiating the crystalline semiconductor film with second laser light in a nitrogen atmosphere or in vacuum; forming an island-shaped semiconductor film by etching the crystalline semiconductor film; and forming a gate insulating film over the island-shaped semiconductor film.

According to another feature of the present invention, a method for manufacturing a semiconductor device includes the steps of forming an amorphous semiconductor film over a substrate having an insulating surface; adding a metal element which promotes crystallization to the amorphous semiconductor film; forming a crystalline semiconductor film by crystallizing the amorphous semiconductor film by first heat treatment; removing a first oxide film which is formed over the crystalline semiconductor film in the first heat treatment with a hydrofluoric acid based solution and forming a second oxide film immediately thereafter with an ozone-containing aqueous solution; irradiating the crystalline semiconductor film over which the second oxide film is formed with first laser light in an air atmosphere or an oxygen atmosphere; forming a semiconductor film containing a rare gas element over the second oxide film; gettering the metal element contained in the crystalline semiconductor film to the semiconductor film containing a rare gas element by second heat treatment; removing the semiconductor film containing a rare gas element and the second oxide film; irradiating the crystalline semiconductor film with second laser light in a nitrogen atmosphere or in vacuum; forming an island-shaped semiconductor film by etching the crystalline semiconductor film; and forming a gate insulating film over the island-shaped semiconductor film.

The present invention has another feature that the second oxide film is formed immediately after removing the first oxide film and before cleaning with pure water.

The present invention has another feature that irradiation with the first laser light is preferably carried out at energy density that is higher than or equal to 350 mJ/cm$^2$ and lower than or equal to 400 mJ/cm$^2$.

The present invention has another feature that irradiation with the second laser light is preferably carried out at energy density that is higher than or equal to 340 mJ/cm$^2$ and lower than or equal to 400 mJ/cm$^2$.

The present invention has another feature that the number of shots of the second laser light is lower than the number of shots of the first laser light.

The present invention has another feature that an interval of time between removal of the first oxide film and irradiation with the first laser light is two hours or less. Specifically, the present invention has a feature that an interval of time from immediately after removal of the first oxide film to immediately before a start of irradiation with the first laser light is two hours or less.

The present invention has another feature that an interval of time between irradiation with the first laser light and formation of the semiconductor film containing a rare gas element is 48 hours or less. Specifically, the present invention has a feature that an interval of time from immediately after irradiation with the first laser light to immediately before formation of the semiconductor film containing a rare gas element is 48 hours or less.

The present invention has another feature that an interval of time between removal of the second oxide film and irradiation with the second laser light is two hours or less. Specifically, the present invention has a feature that an interval of time from immediately after removal of the second oxide film to immediately before a start of irradiation with the second laser light is two hours or less.

The present invention has another feature that one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

By the present invention, a crystalline semiconductor film in which the number of pin holes is reduced can be obtained, and operating characteristics and reliability of a semiconductor device having the crystalline semiconductor film can be improved. In addition, reliability of a display device and an electronic device, which are provided with the semiconductor device with improved operating characteristics and the like, can be improved.

BRIEF DESCRIPTION OF THE DRAWINGS

In the accompanying drawings:

FIG. 1 is a flow chart showing one example of a manufacturing method of a semiconductor device according to the present invention;

FIGS. 8A to 8C are views each showing one example of a manufacturing method of a light-emitting display device according to the present invention;

FIGS. 9A and 9B are views each showing one example of a manufacturing method of a light-emitting display device according to the present invention;

FIGS. 10A and 10B are views each showing one example of a manufacturing method of a light-emitting display device according to the present invention;

FIGS. 12A and 12B are views each showing one example of a manufacturing method of a light-emitting display device according to the present invention;

DESCRIPTION OF THE INVENTION

Figure 2A:
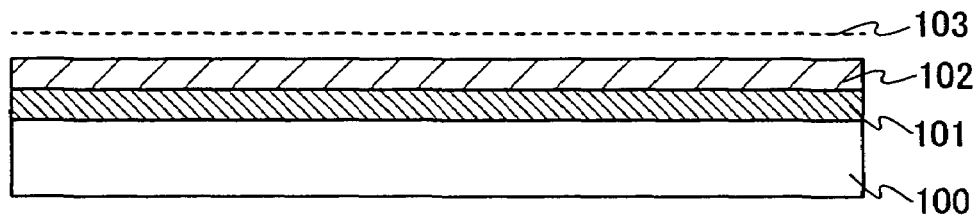
FIGS. 2A to 2D are views each showing one example of a manufacturing method of a semiconductor device according to the present invention.

Hereinafter, embodiment modes and an embodiment of the present invention will be described in detail with reference to the accompanying drawings. It is to be noted that the present invention is not limited to the following description, and it is easily understood by those skilled in the art that modes and details thereof can be modified in various ways without departing from the purpose and the scope of the invention. Therefore, the present invention should not be interpreted as being limited to the description of the embodiment modes and the embodiment to be given below. Further, in a structure of the present invention, which will be described below, the same reference numerals are used for the same portions or portions having the same functions in different drawings.

Embodiment Mode 1

The present invention relates to a process of forming a crystalline semiconductor film over an insulating surface. FIG. 1 shows a flow chart explaining a manufacturing method of a semiconductor device according to the present invention. First, an amorphous semiconductor film is formed over an insulating surface (St1), and then, a metal element which promotes crystallization is added to the amorphous semiconductor film (St2). The amorphous semiconductor film is crystallized by heat treatment to form a crystalline semiconductor film, and an oxide film (a first oxide film) is formed over the crystalline semiconductor film in crystallization by heat treatment (St3), the first oxide film is removed (St4), a new oxide film (a second oxide film) is formed immediately thereafter (St5), and the crystalline semiconductor film is irradiated with first laser light to enhance crystallinity (St6). It is to be noted that a new oxide film (a third oxide film containing the second oxide film) is formed over the crystalline semiconductor film in the first laser light irradiation. Subsequently, a semiconductor film containing a rare gas element is formed over the crystalline semiconductor film (St7), the metal element contained in the crystalline semiconductor film is gettered (St8), the semiconductor film containing a rare gas element, to which the metal element is moved, is removed (St9), the third oxide film is removed (St10), and the crystalline semiconductor film is irradiated with second laser light (St101) to reduce pin holes in the crystalline semiconductor film that is finally obtained.

Hereinafter, an embodiment mode of the present invention will be specifically described with reference to FIGS. 2A to 2D, 3A to 3D, 4A and 4B, 5A and 5B, and 6.

First, a base insulating film 101 is formed over a substrate 100 having an insulating surface (see FIG. 2A). As the substrate 100 having an insulating surface, a light-transmitting substrate may be used. For example, a glass substrate, a crystallized glass substrate, or a plastic substrate (polyimide, acrylic, polyethylene terephthalate, polycarbonate, polyarylate, polyethersulfone, or the like) can be used. When a transistor to be formed later is applied to a light-emitting display device and light emission is extracted using a surface opposite to the substrate 100 side as a display surface, a ceramic substrate, a semiconductor substrate, a metal substrate (tantalum, tungsten, molybdenum, or the like), a substrate obtained by forming an insulating film over a surface of a stainless steel substrate, or the like can be used in addition to the above substrates. It is to be noted that any substrate can be used as long as it resists at least heat generated in a process.

As the base insulating film 101, a film formed using silicon oxide, silicon nitride, silicon nitride containing oxygen, silicon oxide containing a slight amount of nitrogen, or the like can be used, and these films may be formed as a single layer or a multilayer having two or more layers. A method for forming the base insulating film 101 is not particularly limited, and a plasma CVD method, a low pressure CVD method, a sputtering method, a PVD method, or the like may be used. By providing the base insulating film 101, an impurity can be prevented from diffusing from the substrate. In this embodiment mode, the base insulating film 101 is formed as a single layer; however, obviously, it may be a multilayer having two or more layers. Further, the base insulating film is not particularly required to be formed unless unevenness on the substrate or diffusion of an impurity from the substrate becomes a problem.

Then, an amorphous semiconductor film 102 is formed over the base insulating film 101 (see FIG. 2A). As the amorphous semiconductor film 102, silicon, a silicon-germanium (SiGe) alloy, or the like can be formed by a plasma CVD method, a low pressure CVD method, a sputtering method, a PVD method, or the like. It is to be noted that the amorphous semiconductor film 102 may be formed continuously after forming the base insulating film 101 by using the same film-forming apparatus as the base insulating film 101, that is; the amorphous semiconductor film 102 may be formed continuously after forming the base insulating film 101 without exposing the substrate to atmospheric air. Accordingly, an impurity contained in atmospheric air can be prevented from attaching to the amorphous semiconductor film 102.

Thereafter, a metal element 103 which promotes crystallization is added to the amorphous semiconductor film 102 (see FIG. 2A). As the metal element which promotes crystallization, an element such as iron (Fe), nickel (Ni), cobalt (Co), ruthenium (Ru), rhodium (Rh), palladium (Pd), osmium (Os), iridium (Ir), platinum (Pt), copper (Cu), or gold (Au) can be used. By using one or a plurality of the above metal elements, the metal element may be added to the amorphous semiconductor film 102 by a method by which a thin film of the above metal element or silicide of the above metal element is formed by a sputtering method, a PVD method, a low pressure CVD method, a plasma CVD method, an evaporation method, or the like; or a method by which a solution containing the above metal element is applied; or the like. In addition, a mask may be formed over the amorphous semiconductor film 102 to selectively add the metal element.

Further, when adding the metal element 103, it is preferable to form a thin oxide film over the amorphous semiconductor film 102. For example, after forming a thin oxide film having a thickness of 10 to 30 nm over the surface of the amorphous semiconductor film 102, the metal element 103 which promotes crystallization may be held over the oxide film. A method for forming the oxide film is not particularly limited, and the oxide film may be formed by treating the surface of the amorphous semiconductor film 102 with ozone-containing water or an oxidizing solution such as a hydrogen peroxide solution, or may be formed by using a method for generating ozone by ultraviolet ray irradiation in an oxygen atmosphere, or the like (see FIG. 2A).

Figure 2B:
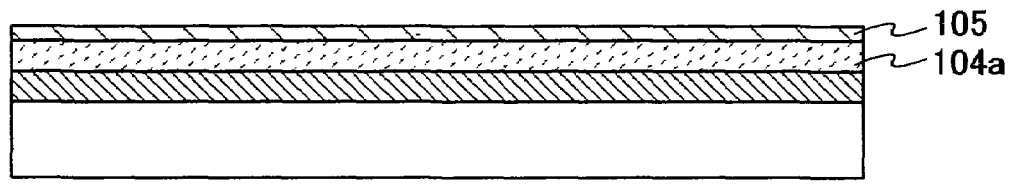

Then, heat treatment is carried out to crystallize the amorphous semiconductor film 102, and a first crystalline semiconductor film 104a is formed (see FIG. 2B). An alloy of the metal element and the semiconductor is formed inside the amorphous semiconductor film 102 by the heat treatment, crystallization progresses with the alloy as a nucleus, and the first crystalline semiconductor film 104a is formed. The first crystalline semiconductor film 104a contains a non-crystalline component and a crystalline component. It is to be noted that a first oxide film 105 is formed over the first crystalline semiconductor film 104a in the heat treatment (see FIG. 2B).

As the heat treatment in crystallization, heat treatment using a rapid thermal annealing (RTA) method, a furnace, or the like may be carried out. An RTA method may be a lamp type RTA method which performs heating by light irradiation, or a gas type RTA method which performs heating by using a high-temperature gas. Preferably, heat treatment is carried out under an atmosphere filled with a gas having low reactivity such as a nitrogen gas or a rare gas. Further, in a case of using an RTA method, a heat treatment temperature may be 600 to 800° C., and heat treatment time may be 3 to 9 minutes. In a case of carrying out heat treatment by using a furnace, a heat treatment temperature may be 500 to 600° C., and heat treatment time may be 3 to 6 hours. It is to be noted that, in a case where a lot of hydrogen is contained in the amorphous semiconductor film 102, hydrogen may be discharged from the amorphous semiconductor film 102 by heat treatment at temperatures of 350 to 500° C. so as to have a hydrogen concentration of $1 \times 10^{20}$ atoms/cm$^3$ or lower, and thereafter, heat treatment for crystallization may be carried out.

Figure 2C:
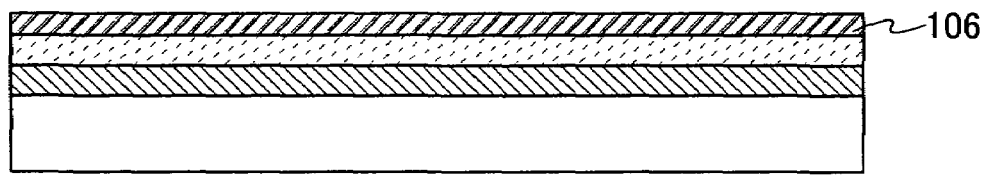
Figure 4A:
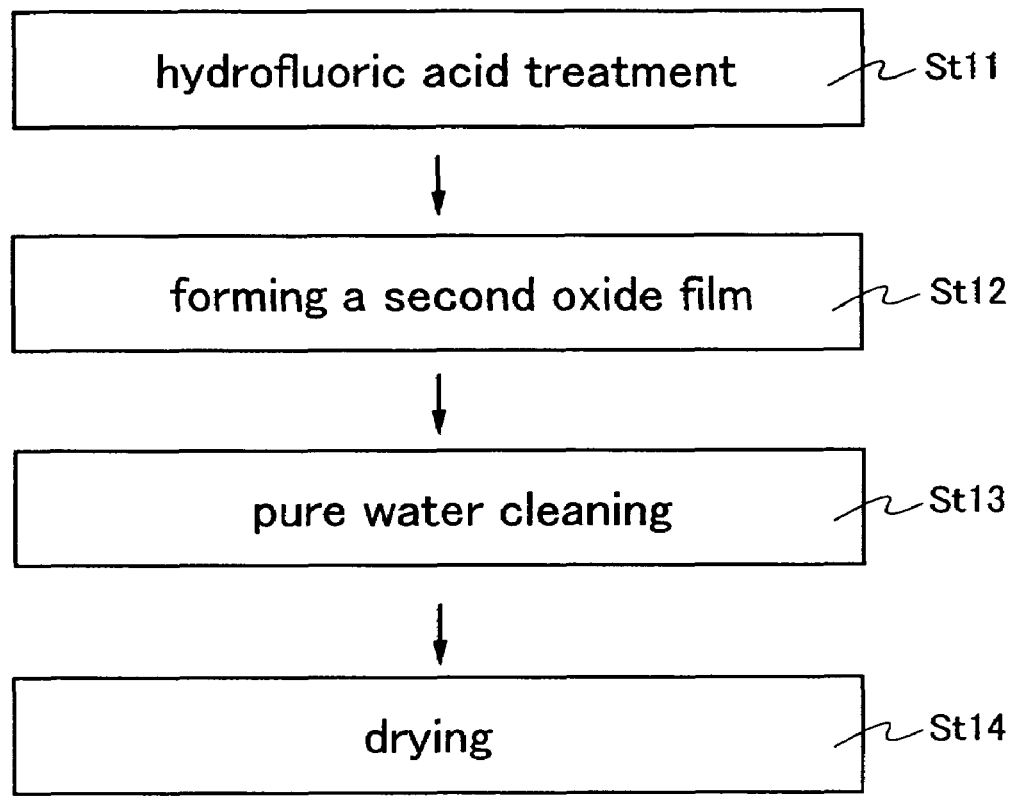
FIGS. 4A and 4B are flow charts each showing one example of a manufacturing method of a semiconductor device according to the present invention.
Figure 4B:
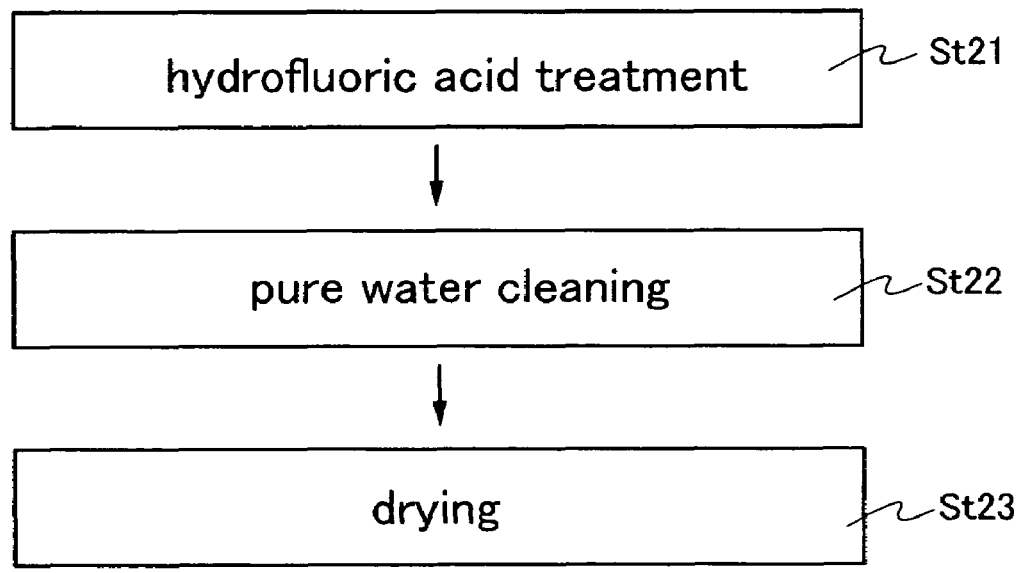

Subsequently, after removing the first oxide film 105 using a hydrofluoric acid based solution, a second oxide film 106 is formed (see FIG. 2C). FIGS. 4A and 4B show flow charts for removing the oxide film using a hydrofluoric acid based solution. In general, in a case of removing the oxide film (the first oxide film 105) by etching using a hydrofluoric acid based solution, steps of hydrofluoric acid treatment (St21), pure water cleaning (St22), and drying (St23) are sequentially carried out (see FIG. 4B). However, in the present invention, after hydrofluoric acid treatment (St11) and before pure water cleaning (St13), a new oxide film (the second oxide film 106) is formed (St12). Thereafter, steps of pure water cleaning (St13) and drying (St14) are carried out. In other words, the present invention has a feature that steps of hydrofluoric acid treatment (St11), formation of an oxide film (the second oxide film 106) (St12), pure water cleaning (St13), and drying (St14) are carried out in this order (see FIG. 4A). It is to be noted that, in FIG. 2C, the second oxide film 106 is preferably formed by treating the surface of the first crystalline semiconductor film 104a with an ozone-containing aqueous solution (typically, ozone water). By treating the surface of the first crystalline semiconductor film 104a with an ozone-containing aqueous solution or the like, a thin oxide film having a thickness of 1 to 10 nm can be formed.

Further, the second oxide film 106 can also be formed similarly by treatment with an oxidizing solution such as a hydrogen peroxide solution instead of an ozone-containing aqueous solution. In addition, ozone may be generated by ultraviolet ray irradiation under an oxygen atmosphere, and the surface of the first crystalline semiconductor film 104a may be oxidized with this ozone to form the second oxide film 106.

In such a manner, since the oxide film (the second oxide film 106) is formed over the first crystalline semiconductor film 104a after hydrofluoric acid treatment and before pure water cleaning, the first crystalline semiconductor film 104a is covered with the oxide film (the second oxide film 106) and not exposed to pure water. Therefore, it is possible to suppress generation of a reaction product which is generated when the semiconductor film, oxygen in atmospheric air, and H$_2$O in pure water react with one another.

Figure 2D:
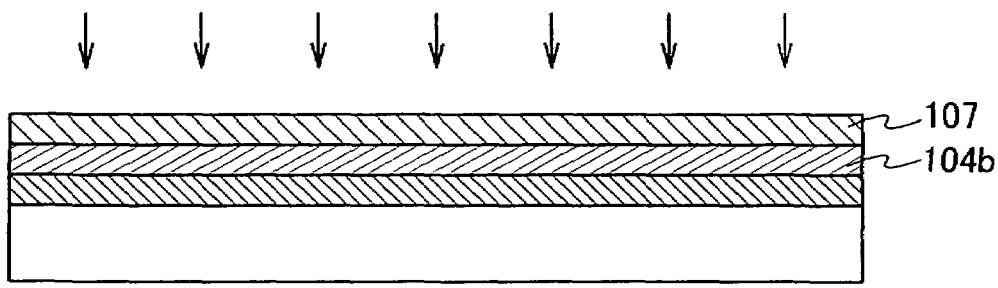

Then, the first crystalline semiconductor film 104a, over the surface of which the second oxide film 106 is formed, is irradiated with laser light (first laser light), and a second crystalline semiconductor film 104b is formed (see FIG. 2D). Irradiation with the first laser light is carried out under an atmosphere containing oxygen, e.g. under an air atmosphere or an oxygen atmosphere. By irradiation with the first laser light, a crystallization rate (a ratio of a crystalline component in entire volume of the semiconductor film) increases than in the first crystalline semiconductor film 104a, and a defect left in a crystal grain can be repaired.

Preferably, a beam spot of the first laser light is shaped to be rectangular by using an optical system. In addition, energy density of the first laser light to be emitted may be higher than or equal to 300 mJ/cm$^2$ and lower than or equal to 450 mJ/cm$^2$, more preferably higher than or equal to 350 mJ/cm$^2$ and lower than or equal to 400 mJ/cm$^2$. Furthermore, a pulsed oscillation laser is preferable as a laser used for irradiation with the first laser light, and for example, a laser having a repetition rate of 30 to 300 Hz can be used. It is to be noted that a continuous wave oscillation (CW) laser may also be used.

Irradiation with the laser light is preferably performed by scanning either the substrate 100 over which the first crystalline semiconductor film 104a is formed or the first laser light so that the first laser light moves relatively to the substrate 100. A scanning rate of the substrate 100 or the first laser light is not particularly limited and may be adjusted so that 10 to 14 shots, more preferably 11 to 12 shots of irradiation are performed at an arbitrary point of the first crystalline semiconductor film 104a. It is to be noted that the number of shots (unit: shot) of the first laser light that is emitted to an arbitrary point can be calculated from the following equation (1).

$$\text{Number of shots} = \frac{\text{Beam width in minor axis direction}(\mu m) \times 10^{-3} \times \text{Oscillating frequency of laser beam (Hz)}}{\text{Scanning rate of substrate or laser beam (mm/sec)}} \quad [\text{Equation 1}]$$

In addition, a laser medium is not particularly limited, and lasers using various laser mediums such as a laser beam emitted from one or more kinds of a gas laser such as an argon laser, a krypton laser, or an excimer laser; a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or more kinds of neodymium (Nd), ytterbium (Yb), chromium (Cr), titanium (Ti), holmium (Ho), erbium (Er), thulium (Tm), and tantalum (Ta) as a dopant; a glass laser; a ruby laser; an alexandrite laser; a Ti: sapphire laser; a copper vapor laser; and a gold vapor laser can be used. By irradiation with the fundamental waves of such a laser beam or the second harmonic to the fourth harmonic laser beam of these fundamental waves, large grain crystal can be obtained. For example, the fundamental wave (1064 nm), the second harmonic (532 nm), or the third harmonic (355 nm) of an Nd:YVO$_4$ laser can be used. As for this laser, either continuous wave oscillation or pulsed oscillation can be performed. In a case of continuous wave oscillation, the power density of the laser needs to be approximately 0.01 to 100 MW/cm$^2$ (preferably, 0.1 to 10 MW/cm$^2$). Then, irradiation is carried out at a scanning rate of approximately 10 to 2000 cm/sec.

Further, a laser using, as a medium, single crystal YAC; YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or more kinds of Nd, Yb, Cr, Ti, Ho, Er, Tm and Ta as a dopant; an Ar ion laser; or a Ti: sapphire laser can perform continuous wave oscillation. In addition, pulsed oscillation at a repetition rate that is higher than or equal to 10 MHz is also possible by carrying out Q-switch operation, mode locking, or the like. When pulsed oscillation of a laser beam at a repetition rate that is higher than or equal to 10 MHz is carried out, the semiconductor film (the first crystalline semiconductor film 104a) is irradiated with the next pulse after melting of the semiconductor film (the first crystalline semiconductor film 104a) by a laser and before solidification thereof. Accordingly, differing from a case of using a pulsed laser at a lower a repetition rate, the solid-liquid interface can be continuously moved in the semiconductor film (the first crystalline semiconductor film 104a), and a crystal grain grown continuously toward the scanning direction can be obtained.

The use of ceramics (polycrystal) as a medium allows the medium to be formed into a free shape at low cost in a short time. Although a columnar medium of several mm in diameter and several tens of mm in length is usually used in a case of using single crystal, larger mediums can be formed in the case of using ceramics.

Since the concentration of the dopant such as Nd or Yb in the medium, which directly contributes to light emission of the laser, cannot be changed significantly both in single crystal and polycrystal, improvement in laser output by increasing the concentration of the dopant has a certain level of limitation. However, in the case of ceramics, drastic improvement in output can be achieved because the size of the medium can be significantly increased as compared with the case of single crystal.

Further, in the case of using ceramics, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, a linear laser beam can be easily shaped as compared with the case of a circular laser beam. The laser beam emitted in such a manner is shaped by using an optical system; accordingly, a linear laser beam having a short side of 1 mm or shorter and a long side of several mm to several m can be easily obtained. In addition, by uniformly irradiating the medium with excited light, an energy distribution of a linear laser beam becomes uniform in a long side direction.

By using such a linear laser beam, the entire surface of the semiconductor film (the first crystalline semiconductor film 104a through the second oxide film 106) can be irradiated more uniformly. In a case where uniform irradiation is required from one end to the other end of the linear laser beam, slits may be provided for the both ends so as to shield a portion where energy is attenuated.

Figure 5A:
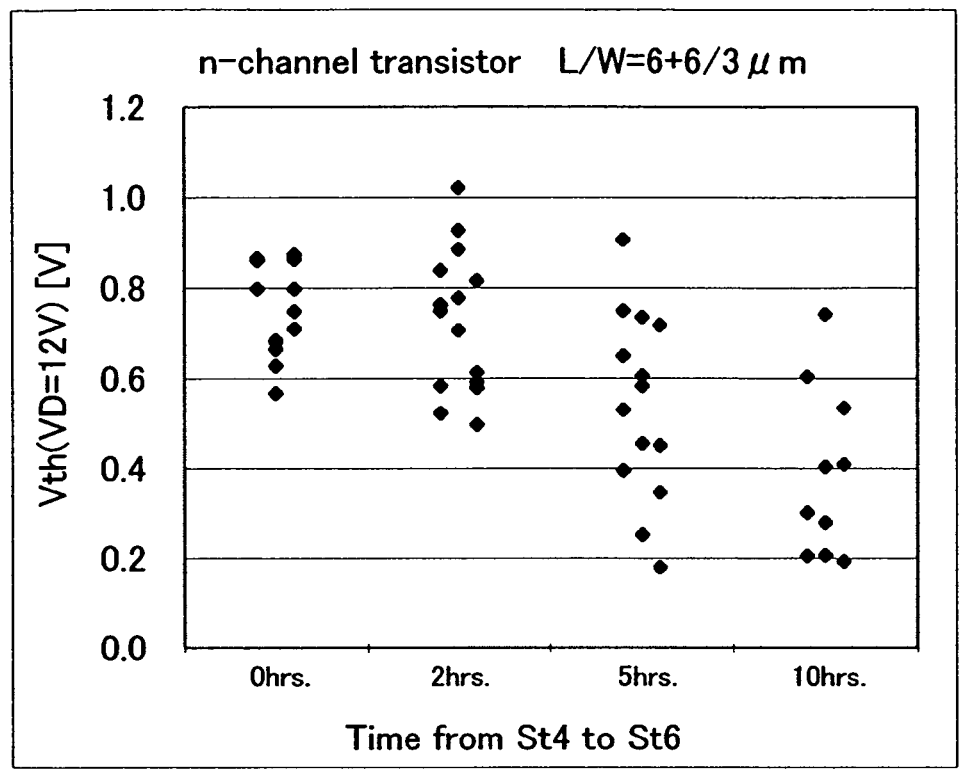
FIGS. 5A and 5B are graphs each showing one example of variation in threshold voltage of a semiconductor device.
Figure 5B:
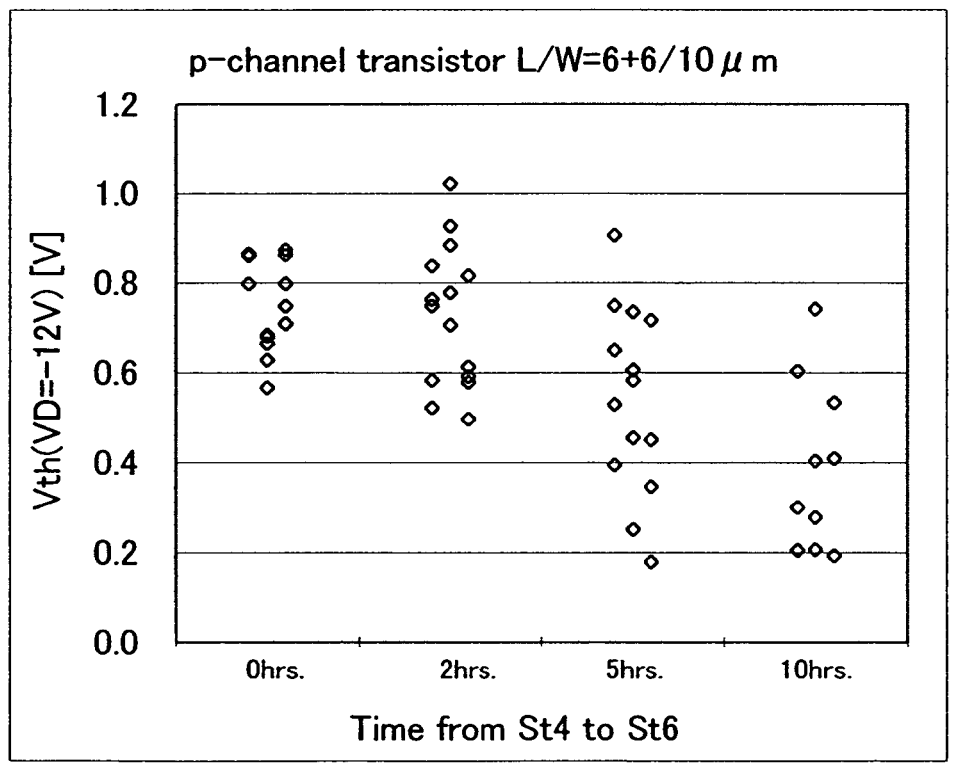

Here, an n-channel transistor and a p-channel transistor are manufactured by using a semiconductor film obtained by irradiation with the first laser light, and threshold voltages of the transistors are measured. FIGS. 5A and 5B show the results. It is to be noted that FIG. 5A shows a measurement result of a threshold voltage of the n-channel transistor, and FIG. 5B shows a measurement result of a threshold voltage of the p-channel transistor.

The n-channel transistor and the p-channel transistor each have a double gate structure having two channel forming regions and two gate electrodes which are arranged correspondingly to two channel forming regions respectively and electrically connected to each other so that the same voltage is applied at the same timing. In each of the two channel forming regions in the n-channel transistor of FIG. 5A, the channel length L is set to be 6 μm and the channel width W is set to be 3 μm. Meanwhile, in each of the two channel forming regions in the p-channel transistor of FIG. 5B, the channel length L is set to be 6 μm and the channel width W is set to be 10 μm.

For one substrate over which a plurality of n-channel transistors are manufactured, threshold voltages of the transistors are measured at 5 points, and FIG. 5A shows threshold voltages of the transistors, which are measured for three substrates at 15 points in total, by plotting them using black diamonds. A vertical axis of FIG. 5A indicates a threshold voltage (Vth) of the transistor when a drain voltage (VD) is set to be 12 V. In addition, a horizontal axis of FIG. 5A indicates time from removal of the first oxide film (St4 in FIG. 1) to the first laser light irradiation (St6 in FIG. 1). According to FIG. 5A, it is understood that the threshold voltages of the transistors vary significantly when two hours or more have passed after the removal of the first oxide film and before the first laser light irradiation.

For one substrate over which a plurality of p-channel transistors are manufactured, threshold voltages of the transistors are measured at 5 points, and FIG. 5B shows threshold voltages of the transistors, which are measured for three substrates at 15 points in total, by plotting them using outline diamonds. A vertical axis and a horizontal axis of FIG. 5B are the same as those in FIG. 5A. According to FIG. 5B, it is understood that the threshold voltages of the transistors vary significantly when two hours or more have passed after the removal of the first oxide film and before the first laser light irradiation.

As described above, there is a concern that the threshold voltages of the transistors vary significantly when two hours or more have passed after the removal of the first oxide film 105 and before the first laser light irradiation. Therefore, it is preferable that the first laser light irradiation be carried out within two hours of the removal of the first oxide film 105, more specifically, an interval of time from immediately after the removal of the first oxide film 105 to immediately before the first laser light irradiation be two hours or less. Concretely, it is preferable that an interval of time from immediately after removing the first oxide film 105 with a hydrofluoric acid based solution to immediately before initially irradiating an arbitrary point of the first crystalline semiconductor film 104a with the first laser light be two hours or less.

In addition, the surface of the second crystalline semiconductor film 104b, which is formed by the first laser light irradiation, becomes uneven. It is estimated that this is because metal elements cohere by the laser light irradiation, and a portion where an alloy of the semiconductor and the metal is formed becomes concave.

Further, in the first laser light irradiation, oxygen in atmospheric air is transmitted through the second oxide film 106 to react with the first crystalline semiconductor film 104a. It is difficult to recognize a clear boundary between a new oxide film that is formed here and the second oxide film 106; therefore, the new oxide film and the second oxide film 106 are collectively referred to as a third oxide film 107 (see FIG. 2D).

Figure 3A:
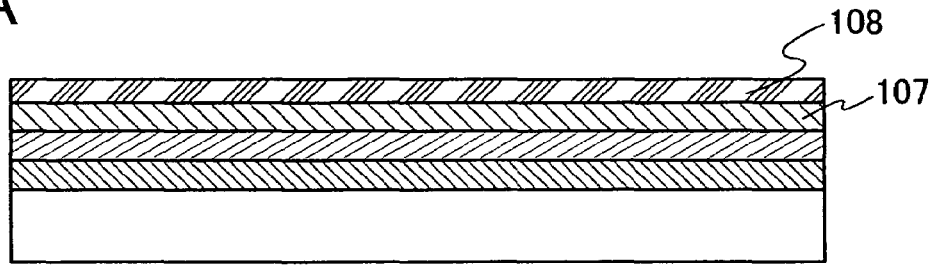
FIGS. 3A to 3D are views each showing one example of a manufacturing method of a semiconductor device according to the present invention.

Subsequently, over the third oxide film 107, an amorphous semiconductor film 108 containing a semiconductor such as silicon or silicon germanium and a rare gas element is formed (see FIG. 3A). The amorphous semiconductor film 108 contains one or more of rare gas elements such as helium (He), neon (Ne), argon (Ar), krypton (Kr), and xenon (Xe). In addition, preferably, a thickness of the amorphous semiconductor film 108 is 20 to 40 nm. When the amorphous semiconductor film 108 contains a rare gas element, a dangling bond or lattice distortion can be formed in the amorphous semiconductor film 108, and gettering can be carried out to the amorphous semiconductor film 108. It is to be noted that, in order to form lattice distortion in the amorphous semiconductor film 108, it is effective to use an element having a larger atomic radius than silicon, such as argon (Ar), krypton (Kr) or xenon (Xe). Further, a semiconductor film containing an impurity element having one conductivity type, such as phosphorus (P) or boron (B), instead of a rare gas element, may also be used.

Figure 3B:
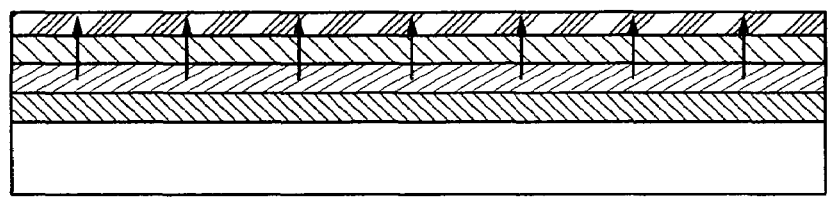

Next, heat treatment is carried out, and the metal element contained in the second crystalline semiconductor film 104b is moved to the amorphous semiconductor film 108 containing a rare gas element (gettering) (see FIG. 3B). By this gettering treatment, the metal element is moved from the second crystalline semiconductor film 104b in a direction of the amorphous semiconductor film 108 containing a rare gas element (a direction indicated by an arrow in FIG. 3B) through the third oxide film 107, and thus, the metal element contained in the second crystalline semiconductor film 104b is reduced or removed (the second crystalline semiconductor film 104b after gettering is referred to as a third crystalline semiconductor film 104c). The movement distance of the metal element contained in the second crystalline semiconductor film 104b may be at least a distance which is approximately equal to a thickness of the second crystalline semiconductor film 104b. It is to be noted that, as the metal element which promotes crystallization is gettered to the amorphous semiconductor film 108 containing a rare gas element, the amorphous semiconductor film 108 becomes a semiconductor film containing a crystalline component but is referred to as the amorphous semiconductor film 108 also after gettering in this embodiment mode for convenience sake.

As the heat treatment for gettering, heat treatment using an RTA method, a furnace, or the like may be carried out, similarly to the case of crystallization. In a case of using an RTA method, a heat treatment temperature may be 600 to 800° C., and heat treatment time may be 3 to 9 minutes. In a case of carrying out heat treatment by using a furnace, a heat treatment temperature may be 500 to 600° C., and heat treatment time may be 3 to 6 hours.

It is to be noted that gettering efficiency depends on a treatment temperature, and gettering proceeds in a shorter time as a temperature is higher. Further, by a condition of heat treatment in the gettering, a degree of crystallinity of the second crystalline semiconductor film 104b is enhanced and a defect left in a crystal grain can be repaired, that is, crystallinity can be improved, concurrently with the gettering.

Figure 6:
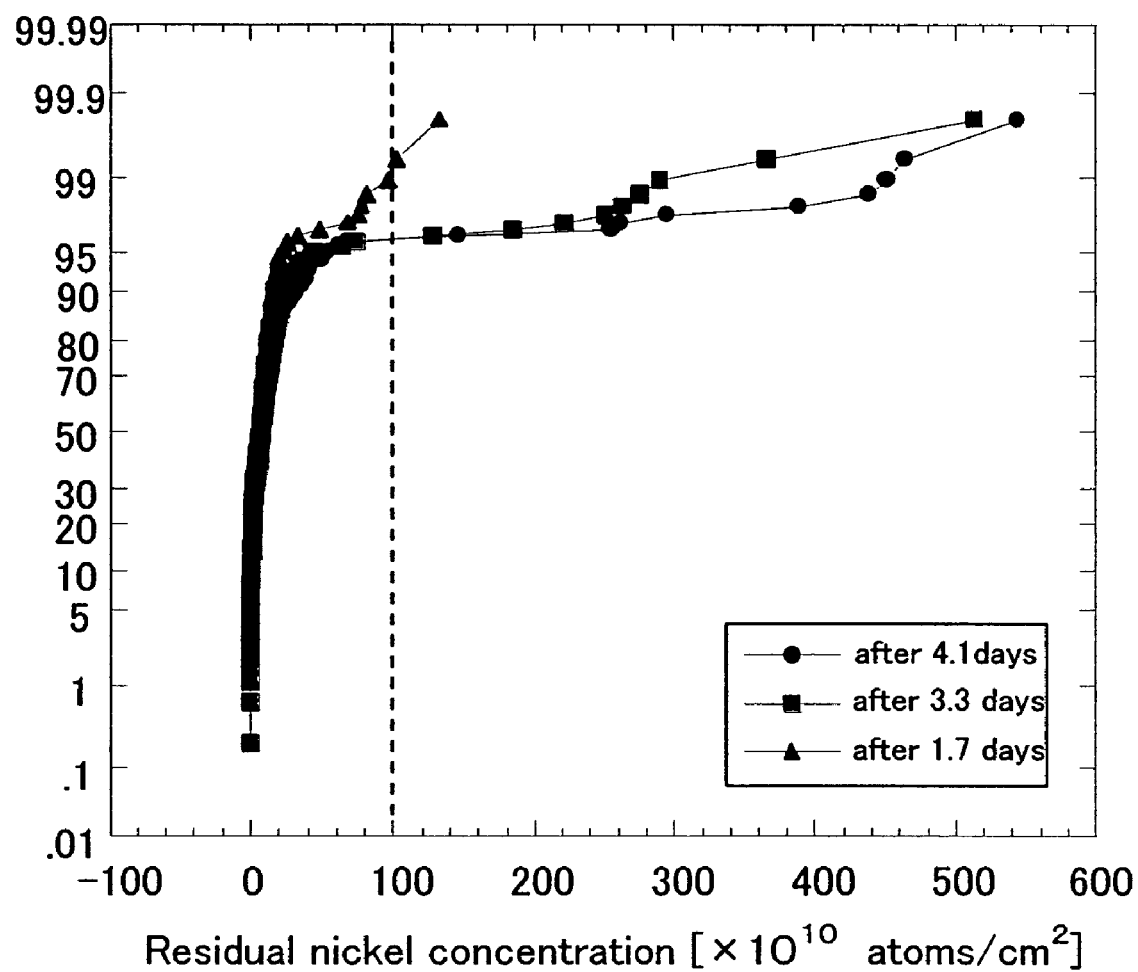
FIG. 6 is a graph showing one example of a statistical probability distribution of a residual nickel concentration in a crystalline semiconductor film.

As for the crystalline semiconductor film after the gettering treatment, FIG. 6 shows a statistical probability distribution of a residual nickel concentration at the crystalline semiconductor film surface. In FIG. 6, time from the first laser light irradiation (corresponding to St6 in FIG. 1) to formation of the semiconductor film containing a rare gas element (corresponding to St7 in FIG. 1) is set to be 1.7 days, and a residual nickel concentration at a crystalline semiconductor film (corresponding to the crystalline semiconductor film obtained in St10 in FIG. 1) surface is measured and plotted using black triangles. In other words, the residual nickel concentration of the crystalline semiconductor film surface is measured, which is obtained by, after the gettering treatment, removing the semiconductor film containing a rare gas element and further removing the oxide film formed over the crystalline semiconductor film. Similarly, time from St6 to St7 in FIG. 1 is set to be 3.3 days, and a residual nickel concentration of the crystalline semiconductor film obtained in St10 is measured and plotted using black squares. Further, time from St6 to St7 in FIG. 1 is set to be 4.1 days, and a residual nickel concentration of the crystalline semiconductor film obtained in St10 is measured and plotted using black circles. It is to be noted that, in FIG. 6, residual nickel concentrations measured at 234 points in total, 13 points for each substrate and the number of substrates is 18, are plotted for each crystalline semiconductor film under each condition. In FIG. 6, a vertical axis indicates a percentage, and a value of 50% corresponds to a median of the residual nickel concentration. A horizontal axis indicates the residual nickel concentration (atoms/cm$^2$). Further, in FIG. 6, a scale of a residual nickel concentration $1 \times 10^{12}$ atoms/cm$^2$ is shown by a dotted line. In a case where the residual nickel concentration of $1 \times 10^{12}$ atoms/cm$^2$ or lower is made to be an acceptable value, a defect generating rate is approximately 5% under a condition where time from St6 to St7 is set to be 3.3 days and a condition where time from St6 to St7 is set to be 4.1 days while a defect generating rate is approximately 1% under a condition where time from St6 to St7 is set to be 1.7 days. From these results, it is understood that a gettering-defect generating rate is increased as elapsed time from St6 to St7 is longer.

As described above, when an interval of time between the first laser light irradiation and formation of the amorphous semiconductor film 108 containing a rare gas element is 1.7 days or more, an impurity such as an organic substance is attached to the crystalline semiconductor film surface; thus, there is a concern that the gettering efficiency is lowered, and a gettering defect of the metal element contained in the crystalline semiconductor film is caused. Accordingly, it is preferable that an interval of time from immediately after the first laser light irradiation to before formation of the amorphous semiconductor film 108 containing a rare gas element be two days or less. Concretely, it is preferable that an interval of time from immediately after lastly irradiating the first crystalline semiconductor film 104a with the first laser light to immediately before forming the amorphous semiconductor film 108 containing a rare gas element be two days or less.

Figure 3C:
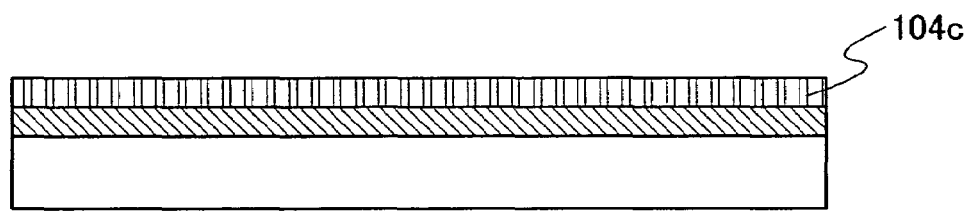

After the gettering, the amorphous semiconductor film 108 containing a rare gas element and the third oxide film 107 are removed (see FIG. 3C). First, by using the third oxide film 107 as an etching stopper, the amorphous semiconductor film 108 containing a rare gas element is selectively etched and removed. As an etching method of the amorphous semiconductor film 108 containing a rare gas element, wet etching with an alkaline solution such as tetramethylammonium hydroxide (TMAH) or choline can be utilized. It is to be noted that, in a case where an oxide film such as a natural oxide film is formed over the amorphous semiconductor film 108 containing a rare gas element, the amorphous semiconductor film 108 containing a rare gas element is preferably etched after removing the above oxide film with a hydrofluoric acid based solution in advance. After removing the amorphous semiconductor film 108 containing a rare gas element, the third oxide film 107 is removed by etching with a hydrofluoric acid based solution.

Figure 3D:
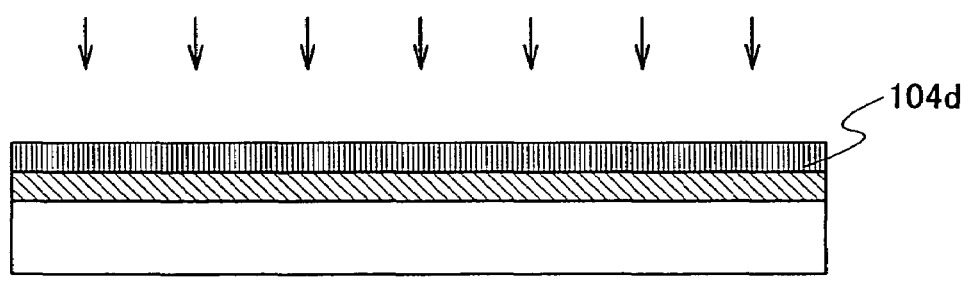

Then, the third crystalline semiconductor film 104c is irradiated with second laser light, and a fourth crystalline semiconductor film 104d is formed (see FIG. 3D). Irradiation with the second laser light is carried out under a nitrogen atmosphere or in vacuum. In addition, the third crystalline semiconductor film 104c may be irradiated with the second laser light while spraying a nitrogen gas. By irradiating the third crystalline semiconductor film 104c with the second laser light, the fourth crystalline semiconductor film 104d in which pin holes are reduced can be formed. For example, when there are pin holes in the third crystalline semiconductor film 104c, pin holes can be filled up by irradiating the third crystalline semiconductor film 104c with the laser light.

Preferably, a beam spot of the second laser light is shaped to be rectangular by using an optical system, similarly to the first laser light. In addition, energy density of the second laser light to be emitted may be higher than or equal to 285 mJ/cm$^2$ and lower than or equal to 475 mJ/cm$^2$, more preferably higher than or equal to 340 mJ/cm$^2$ and lower than or equal to 400 mJ/cm$^2$. Furthermore, a pulsed oscillation laser is preferable as a laser used for irradiation with the second laser light, and for example, a laser having a repetition rate of 30 to 300 Hz can be used. It is to be noted that a continuous wave oscillation (CW) laser may also be used. Further, a laser medium and the like are not particularly limited, and the same condition as in the first laser light can be used.

Irradiation with the second laser light is preferably performed by scanning either the substrate 100 over which the third crystalline semiconductor film 104c is formed or the second laser light so that the second laser light moves relatively to the substrate 100. A scanning rate of the substrate 100 or the second laser light is not particularly limited and may be adjusted so that 5 to 14 shots, more preferably 5 to 6 shots of irradiation are performed at an arbitrary point of the third crystalline semiconductor film 104c. More preferably, the number of shots of the second laser light is set to be about half of the number of shots of the first laser light. By reducing the number of shots, process time can be shortened. It is to be noted that the number of shots (unit: shot) of the second laser light that is emitted to an arbitrary point can be calculated from the equation (1).

It is to be noted that there is a concern that the threshold voltages of the transistors vary when an interval of time between the removal of the third oxide film 107 and the second laser light irradiation is two hours or more. Accordingly, it is preferable that an interval of time from immediately after the removal of the third oxide film 107 to immediately before the second laser light irradiation be two hours or less. Concretely, it is preferable that an interval of time from immediately after removing the third oxide film 107 with a hydrofluoric acid based solution to immediately before initially irradiating an arbitrary point of the third crystalline semiconductor film 104c with the second laser light be two hours or less.

Through the above process, the planarized fourth crystalline semiconductor film 104d in which pin holes are reduced can be obtained. When a transistor is formed by using a crystalline semiconductor film in which pin holes are reduced as described above, coverage of a gate insulating film that is formed afterwards becomes favorable, and thinning is also possible. Therefore, a semiconductor device with improved operating characteristics and reliability can be manufactured.

Embodiment Mode 2

A manufacturing method of a semiconductor device according to the present invention and a light-emitting display device using the semiconductor device will be described with reference to FIGS. 7A to 7C, 8A to 8C, 9A and 9B, 10A and 10B, 11A and 11B, 12A and 12B, 13A and 13B, 14, and 15A to 15C.

Figure 7A:
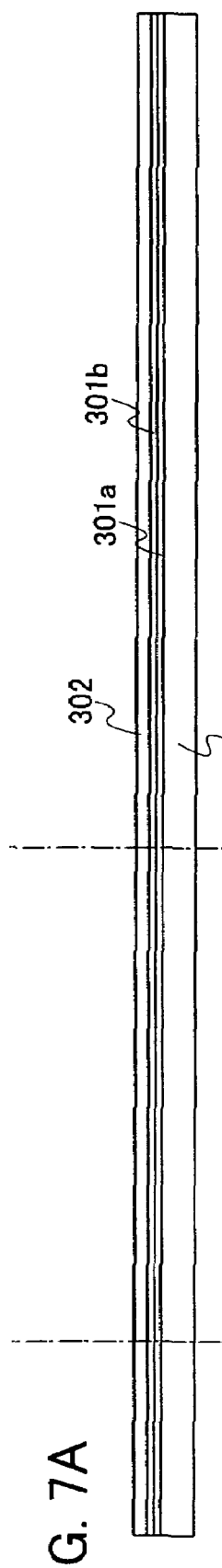
FIGS. 7A to 7C are views each showing one example of a manufacturing method of a light-emitting display device according to the present invention.

First, base insulating films 301a and 301b are stacked over a substrate 300 having an insulating surface (see FIG. 7A). As the substrate 300, a light-transmitting substrate may be used, and a glass substrate is used in this embodiment mode. When a transistor to be formed later is applied to a light-emitting display device and light emission is extracted using a surface opposite to the substrate 300 side as a display surface, a ceramic substrate, a semiconductor substrate, a metal substrate (tantalum, tungsten, molybdenum, or the like), a substrate obtained by forming an insulating film over a surface of a stainless steel substrate, or the like can also be used The base insulating film 301a is preferably formed so that an impurity is prevented from diffusing from the substrate 300, and for example, a film formed using silicon nitride, silicon nitride containing oxygen, or the like may be used. Since the base insulating films 301a and 301b are formed in a stacked layer structure in this embodiment mode, the base insulating film 301b is preferably formed using a film, which makes a stress difference generated between the base insulating film 301b and a semiconductor film to be formed afterwards small. For example, the base insulating film 301a is to be a film formed using silicon oxide, silicon nitride containing oxygen, or the like, and the base insulating film 301b is to be a film formed using silicon oxide, silicon oxide containing a slight amount of nitrogen, or the like. A method for forming the base insulating films 301a and 301b is not particularly limited, and a plasma CVD method, a low pressure CVD method, a sputtering method, a PVD method, or the like may be used. In this embodiment mode, the base insulating film 301a is formed using a silicon nitride film containing oxygen having a thickness in a range of 120 to 160 nm, and the base insulating film 301b is formed using a silicon oxide film containing a slight amount of nitrogen having a thickness in a range of 90 to 110 nm. It is to be noted that the base insulating film may be a single layer, or a multilayer having two or more layers. The base insulating film is not particularly required to be formed unless unevenness on the substrate or diffusion of an impurity from the substrate becomes a problem.

Subsequently, a crystalline semiconductor film 302 is formed over the base insulating film 301b (see FIG. 7A). It is to be noted that steps up to second laser light irradiation to form the crystalline semiconductor film 302 are the same as those in Embodiment Mode 1; therefore, a simplified description will be given hereinafter.

First, an amorphous semiconductor film containing a semiconductor such as silicon or silicon-germanium is formed over the base insulating film 301b. In this embodiment mode, silicon is formed to have a thickness of 40 to 60 nm. It is to be noted that the amorphous semiconductor film may be formed continuously after forming the base insulating films 301a and 301b by using the same film-forming apparatus as the base insulating films 301a and 301b, that is; the amorphous semiconductor film may be formed continuously after forming the base insulating films 301a and 301b without exposing the substrate to atmospheric air. Accordingly, an impurity contained in atmospheric air can be prevented from attaching to the amorphous semiconductor film.

Next, after forming a thin oxide film having a thickness of 10 to 30 nm over the surface of the amorphous semiconductor film, a metal element is attached to the oxide film by treating the oxide film surface with a solution containing a metal element which promotes crystallization. Alternatively, a film containing a metal element which promotes crystallization may be formed over the oxide film by using a sputtering method or the like. It is to be noted that, as a solution containing a metal element which promotes crystallization, for example, a metal salt solution such as a nickel acetate solution may be used. A method for forming the oxide film over the surface of the amorphous semiconductor film is not particularly limited, and the oxide film may be formed by treating the surface of the amorphous semiconductor film with ozone water or an oxidizing solution such as a hydrogen peroxide solution, or may be formed by using a method for generating ozone by ultraviolet ray irradiation in an oxygen atmosphere, or the like.

Then, the amorphous semiconductor film is crystallized by heat treatment using an RTA method, and a first semiconductor film containing a non-crystalline component and a crystalline component is formed. In a case of carrying out the heat treatment using an RTA method, heat treatment may be carried out at temperatures of 600 to 800° C. for 3 to 9 minutes. In addition, the heat treatment may be carried out using a furnace or the like, and in that case, the heat treatment is preferably carried out at temperatures of 500 to 600° C. for 3 to 6 hours. It is to be noted that, in a case where a lot of hydrogen is contained in the amorphous semiconductor film, hydrogen may be discharged from the amorphous semiconductor film by heat treatment at temperatures of 350 to 500° C. so as to have a hydrogen concentration of $1 \times 10^{20}$ atoms/$cm^3$ or lower, and thereafter, heat treatment for crystallization may be performed.

Subsequently, an oxide film (first oxide film) formed over the first semiconductor film in the heat treatment for crystallization is removed with a hydrofluoric acid based solution, and a new oxide film (second oxide film) having a thickness of 1 to 10 nm is formed by treating the surface of the first semiconductor film with an ozone-containing aqueous solution. It is to be noted that the second oxide film is formed over the first semiconductor film before cleaning with pure water after removing the first oxide film by etching with a hydrofluoric acid based solution. In such a manner, since the first semiconductor film is covered with the second oxide film before cleaning with pure water, the first semiconductor film is not exposed to pure water. Therefore, generation of a watermark can be suppressed.

Irradiation with first laser light is carried out under an air atmosphere to the first semiconductor film containing a non-crystalline component and a crystalline component, and a second semiconductor film in which a crystallization rate increases is formed. Preferably, a beam spot of the first laser light is shaped to be rectangular by using an optical system.

Irradiation with the first laser light is performed by scanning either the substrate 300 over which the first semiconductor film is formed or the first laser light so that the first laser light moves relatively to the substrate 300. Further, a pulsed oscillation laser is preferable as the first laser light, and for example, a laser having a repetition rate of 30 to 300 Hz can be used. In addition, energy density of the first laser light to be emitted may be higher than or equal to 300 mJ/$cm^2$ and lower than or equal to 450 mJ/$cm^2$. In this embodiment mode, irradiation with the laser light is carried out at energy density that is higher than or equal to 350 mJ/$cm^2$ and lower than or equal to 400 mJ/$cm^2$.

A scanning rate of the substrate 300 or the first laser light is not particularly limited and may be adjusted so that 10 to 14 shots of irradiation are performed at an arbitrary point of the first semiconductor film. In this embodiment mode, a scanning rate of the substrate 300 or the first laser light is adjusted so that 11 to 12 shots of irradiation are performed at an arbitrary point of the first semiconductor film. It is to be noted that the number of shots (unit: shot) of the first laser light that is emitted to an arbitrary point can be calculated from the equation (1).

It is to be noted that there is a concern that the threshold voltages of the transistors vary when an interval of time between the removal of the first oxide film and the first laser light irradiation is two hours or more. Accordingly, it is preferable that an interval of time from immediately after the removal of the first oxide film to immediately before the first laser light irradiation be two hours or less. Concretely, it is preferable that an interval of time from immediately after removing the first oxide film with a hydrofluoric acid based solution, through formation of the new oxide film (the second oxide film), to immediately before initially irradiating an arbitrary point of the first semiconductor film with the first laser light be two hours or less.

Further, in the first laser light irradiation, oxygen in atmospheric air reacts with the first semiconductor film, and an oxide film is formed. It is difficult to recognize a clear boundary between a new oxide film that is formed here and the second oxide film; therefore, the new oxide film and the second oxide film are collectively referred to as a third oxide film.

A laser medium of the first laser light is not particularly limited, and a laser having the same laser medium as in Embodiment Mode 1, such as an excimer laser, an argon laser, a krypton laser, a YAG laser, a $YVO_4$ laser, a $YAlO_3$ laser, or a $Y_2O_3$ laser can be used.

Subsequently, over the third oxide film, an amorphous semiconductor film containing a semiconductor such as silicon or silicon germanium and a rare gas element such as Ar is formed. Thereafter, heat treatment (gettering) is carried out by using an RTA method. The third oxide film is provided between the second semiconductor film and the amorphous semiconductor film containing a rare gas element. The amorphous semiconductor film containing a rare gas element is formed by a plasma CVD method, a low pressure CVD method, a sputtering method, a PVD method, or the like so as to to have a thickness of 20 to 40 nm. In a case of carrying out heat treatment using an RTA method, heat treatment may be carried out at temperatures of 600 to 800° C. for 3 to 9 minutes. In addition, the heat treatment may also be carried out using a furnace or the like, and in that case, the heat treatment may be carried out at temperatures of 500 to 600° C. for 3 to 6 hours. By the heat treatment, the metal element which promotes crystallization contained in the second semiconductor film is gettered to the amorphous semiconductor film containing a rare gas element. It is to be noted that the second semiconductor film after the gettering is referred to as a third semiconductor film. As the metal element which promotes crystallization is gettered to the amorphous semiconductor film containing a rare gas element, the amorphous semiconductor film containing a rare gas element becomes a semiconductor film containing a crystalline component but is referred to as the amorphous semiconductor film containing a rare gas element for convenience sake here.

It is to be noted that, when an interval of time between the first laser light irradiation and formation of the amorphous semiconductor film containing a rare gas element is 2 days or more, there is a concern that a gettering defect that the metal element in the second semiconductor film is not easily removed or the like is caused. Accordingly, it is preferable that an interval of time from immediately after the first laser light irradiation to immediately before formation of the amorphous semiconductor film containing a rare gas element be two days or less. Concretely, it is preferable that an interval of time from immediately after lastly irradiating the first semiconductor film with the first laser light to immediately before forming the amorphous semiconductor film containing a rare gas element be two days or less.

After the gettering, the amorphous semiconductor film containing a rare gas element is removed by carrying out etching selectively with an alkaline solution such as TMAH. As the etching of the amorphous semiconductor film containing a rare gas element, wet etching with an alkaline solution such as choline may also be used. The third oxide film serves as a stopper to prevent the third semiconductor film from being etched in the etching of the amorphous semiconductor film containing a rare gas element. It is to be noted that, in a case where an oxide film such as a natural oxide film is formed over the surface of the amorphous semiconductor film containing a rare gas element, the amorphous semiconductor film containing a rare gas element is preferably etched after removing the above oxide film with a hydrofluoric acid based solution or the like in advance. After removing the amorphous semiconductor film containing a rare gas element, the third oxide film is removed with a hydrofluoric acid based solution.

Then, the third semiconductor film is irradiated with second laser light while spraying a nitrogen gas so as to be crystallized again, and the crystalline semiconductor film 302 which is a fourth semiconductor film is formed (see FIG. 7A). Preferably, a beam spot of the second laser light is shaped to be rectangular by using an optical system. Irradiation with the second laser light is performed by scanning either the substrate 300 over which the third semiconductor film is formed or the second laser light so that the second laser light moves relatively to the substrate 300. A pulsed oscillation laser is preferable as the second laser light, and for example, a laser having a repetition rate of 30 to 300 Hz can be used. In addition, irradiation with the second laser light is carried out at energy density that is higher than or equal to 275 mJ/cm$^2$ and lower than or equal to 475 mJ/cm$^2$. In this embodiment mode, irradiation with the laser light is carried out at energy density that is higher than or equal to 340 mJ/cm$^2$ and lower than or equal to 400 mJ/cm$^2$.

A scanning rate of the substrate 300 or the second laser light is not particularly limited and may be adjusted so that 5 to 14 shots of irradiation are performed at an arbitrary point of the third semiconductor film. In this embodiment mode, a scanning rate of the substrate 300 or the second laser light is adjusted so that 5 to 6 shots of irradiation are performed at an arbitrary point of the third semiconductor film. More preferably, the number of shots of the second laser light is set to be about half of the number of shots of the first laser light. By reducing the number of shots of the second laser light, process time can be shortened. The number of shots (unit: shot) of the second laser light that is emitted to an arbitrary point can be calculated from the equation (1).

It is to be noted that there is a concern that the threshold voltages of the transistors vary when an interval of time between the removal of the third oxide film and the second laser light irradiation is two hours or more. Accordingly, it is preferable that an interval of time from immediately after the removal of the third oxide film to immediately before the second laser light irradiation be two hours or less. Concretely, it is preferable that an interval of time from immediately after removing the third oxide film with a hydrofluoric acid based solution to immediately before initially irradiating an arbitrary point of the third semiconductor film with the second laser light be two hours or less.

Through the above process, the crystalline semiconductor film 302 in which pin holes are reduced can be obtained. When a transistor is formed by using a crystalline semiconductor film in which pin holes are reduced as described above, coverage of a gate insulating film that is formed afterwards is favorable, and thinning of the gate insulating film is also possible.

Figure 7B:
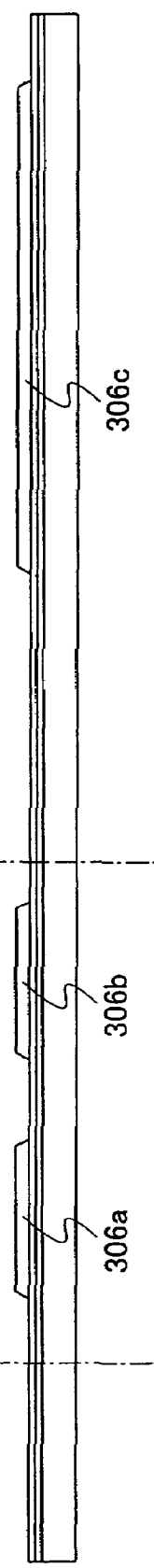

Then, the crystalline semiconductor film 302 is processed into a desired shape, and island-shaped semiconductor films 306a, 306b, and 306c are obtained (see FIG. 7B). A method for processing the crystalline semiconductor film 302 is not particularly limited, and for example, a method can be used, by which, after forming a resist mask over the crystalline semiconductor film 302, an unnecessary portion is removed by etching. A method for forming a resist mask is not particularly limited either, and in addition to a photolithography method, a method may be used, by which a mask with a desired shape is formed by drawing while controlling a timing and position of discharging a droplet as in an ink jet method. Further, an etching method is not particularly limited, and either a dry etching method or a wet etching method may be used.

It is to be noted that the semiconductor films 306a to 306c may be doped with an impurity to control a threshold voltage of a transistor. An impurity that is added is not particularly limited, and an impurity imparting n-type conductivity such as phosphorus or arsenic, or an impurity imparting p-type conductivity such as boron may be used. Further, a timing of adding an impurity to control the threshold voltage is not particularly limited, and the impurity may be added after forming the crystalline semiconductor film 302 and before forming the island-shaped semiconductor films 306a to 306c, or after forming the island-shaped semiconductor films 306a to 306c and before forming a gate insulating film 307 which is formed in a subsequent step. In addition, in this step, the impurity may be entirely added to the island-shaped semiconductor films 306a to 306c, or partially added by covering part of the island-shaped semiconductor films using a resist or the like.

Figure 7C:
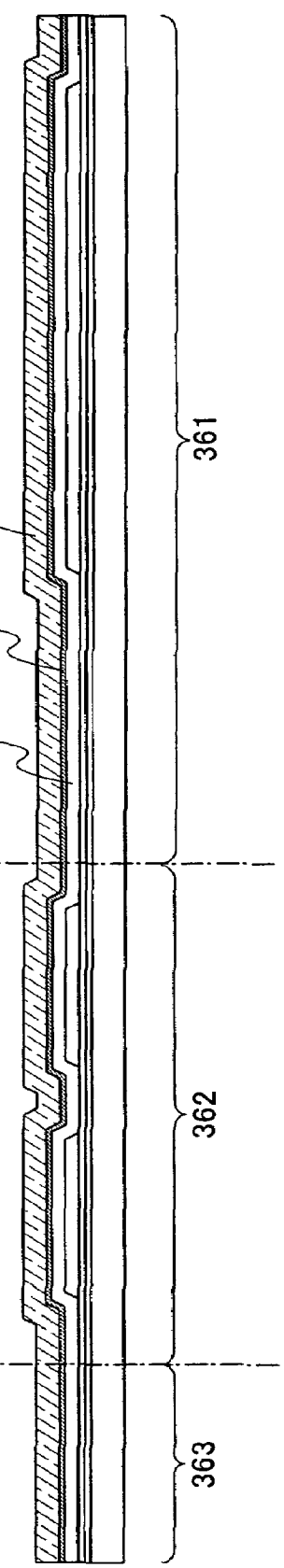

Next, the gate insulating film 307 is formed so as to cover the island-shaped semiconductor films 306a to 306c (see FIG. 7C). A method for forming the gate insulating film 307 is not particularly limited, and the gate insulating film 307 may be formed by a plasma CVD method, a low pressure CVD method, a sputtering method, a PVD method, or the like. Alternatively, an insulating film that is formed is oxidized or nitrided by plasma treatment to from a gate insulating film. In addition, the surfaces of the island-shaped semiconductor films 306a to 306c may be oxidized or nitrided by plasma treatment to form the gate insulating film 307. The gate insulating film 307 may be formed using silicon oxide, silicone nitride, silicon oxide containing nitrogen, silicon nitride containing oxygen, or the like to have a thickness of 1 to 200 nm. Further, the gate insulating film 307 may be a single layer or have a stacked layer structure including layers formed using different substances.

Then, gate electrodes 311a, 311b, 311c, and 311d, and a capacitor electrode 311e are formed over the gate insulating film 307. A structure of the gate electrode and a method for forming the gate electrode are not particularly limited. In this embodiment mode, a method for forming the gate electrodes 311a to 311d and the capacitor electrode 311e which are formed by stacking a first conductive layer 308 and a second conductive layer 309 will be described hereinafter.

First, the first conductive layer 308 is formed over the gate insulating film 307, and the second conductive layer 309 is formed over the first conductive layer 308 (see FIG. 7C). Preferably, the first conductive layer 308 and the second conductive layer 309 are respectively formed using different conductive substances. The first conductive layer 308 is preferably formed using a conductive substance of which adhesiveness with the gate insulating film 307 is high, and for example, titanium nitride (TiN), tantalum nitride (TaN), titanium (Ti), tantalum (Ta), or the like is preferably used. In addition, the first conductive layer 308 is preferably formed to have a thickness in a range of 25 to 35 nm.

The second conductive layer 309 is preferably formed using a conductive substance of which resistivity is low, and for example, tungsten (W), molybdenum (Mo), aluminum (Al), copper (Cu), an alloy containing these metals as its main component, a metal compound containing these metals, or the like is preferably used. As the alloy, an alloy of aluminum and silicon, an alloy of aluminum and neodymium, or the like can be given. As the metal compound, tungsten nitride or the like can be given. Further, preferably, the second conductive layer 309 is formed to have a thickness in a range of 330 to 410 nm. A method for forming the first conductive layer 308 and the second conductive layer 309 is not particularly limited, and a sputtering method, an evaporation method, or the like can be used. In this embodiment mode, tantalum nitride is used as the first conductive layer 308 and tungsten is used as the second conductive layer 309 (see FIG. 7C).

Subsequently, masks 335a, 335b, 335c, 335d, and 335e are formed over the second conductive layer 309. Then, the first conductive layer 308 and the second conductive layer 309 are etched, and first conductive layers 308a, 308b, 308c, 308d, and 308e, and second conductive layers 309a, 309b, 309c, 309d, and 309e are formed so that a sidewall of each conductive layer has an inclination with respect to a horizontal-plane of each conductive layer (see FIG. 8A).

Next, with the masks 335a to 335e provided, the second conductive layers 309a to 309e are selectively etched, and third conductive layers 310a, 310b, 310c, 310d, and 310e are formed. At this time, it is preferable that etching be carried out under a condition with a high anisotropic property so that a sidewall of each of the third conductive layers 310a to 310e is perpendicular with respect to a horizontal-plane of each conductive layer. Accordingly, inclined portions on the sidewalls of the second conductive layers 309a to 309e are removed. In this manner, the third conductive layers 310a to 310e each having a shorter width than each of the first conductive layers 308a to 308e are formed over the first conductive layers 308a to 308e respectively, and thus, the gate electrodes 311a to 311d and the capacitor electrode 311e, which are formed by combining the first conductive layers 308a to 308e with the third conductive layers 310a to 310e respectively, can be formed (see FIG. 8B).

It is to be noted that each of the masks 335a to 335e may be a mask obtained by being formed into a desired shape and further narrowed by ashing. By using such a mask, an electrode having a more minute shape can be formed, and as a result, a transistor having a shorter channel length can be obtained. When a transistor having a shorter channel length is manufactured, a circuit which operates with higher speed can be obtained.

It is to be noted that, when the channel length of a transistor is shortened as described above, a threshold voltage is lowered due to short channel effect, and electric characteristics of the transistor are adversely affected. When a gate insulating film is thinned, short channel effect can be effectively suppressed. However, on the other hand, when thinning the gate insulating film, a problem such as electric leak or low withstand voltage of the gate insulating film is caused. Further, it is also said that unevenness or the like on the crystalline semiconductor film which is in contact affects characteristics of the gate insulating film. Therefore, it is necessary to reduce pin holes in the crystalline semiconductor film and more planarize the crystalline semiconductor film, and a method for manufacturing a crystalline semiconductor film, in which pin holes are reduced, according to the present invention is highly effective.

Subsequently, by using the gate electrodes 311a to 311d and the capacitor electrode 311e as masks, an impurity element imparting n-type conductivity is added to provide first n-type impurity regions 312a, 312b, and 312c. The impurity element imparting n-type conductivity is not particularly limited, and phosphorus, arsenic, or the like can be used (see FIG. 8C).

After removing the masks 335a to 335e, a mask 336a covering the semiconductor film 306a and a mask 336b covering the semiconductor film 306c are formed. By using the masks 336a and 336b and the third conductive layer 310b as a mask, an impurity element imparting n-type conductivity is further added to the semiconductor film 306b; therefore, second n-type impurity regions (low-concentration impurity regions) 313a are provided each in a region overlapped with the first conductive layer 308b, and third n-type impurity regions 314a are provided each in a region overlapped with neither the first conductive layer 308b nor the third conductive layer 310b. The thus formed third n-type impurity region 314a serves as a source or a drain of a transistor. Further, by providing the second n-type impurity region 313a, which is overlapped with the gate electrode 311b through the gate insulating film 307; is provided between the third n-type impurity region 314a serving as a source or a drain and a channel forming region 315a; has the same conductivity type as that of the third n-type impurity region 314a; and has a lower concentration than that of the third n-type impurity region 314a, an n-channel transistor 352 having excellent resistance to hot carrier deterioration can be obtained. It is to be noted that a region interposed between the second n-type impurity regions 313a serves as the channel forming region 315a (see FIG. 9A).

Figure 15A:
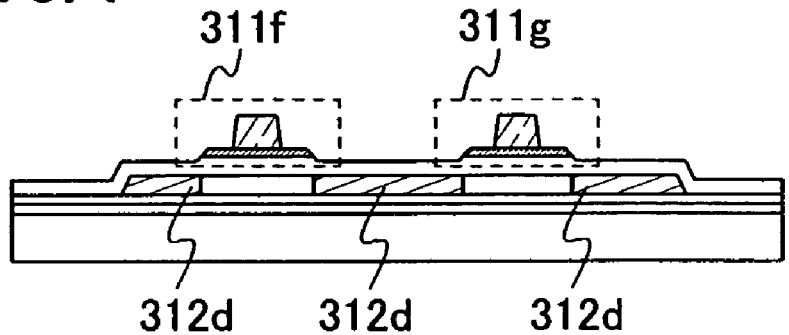
FIGS. 15A to 15C are views each showing one example of a manufacturing method of a light-emitting display device according to the present invention.
Figure 15B:
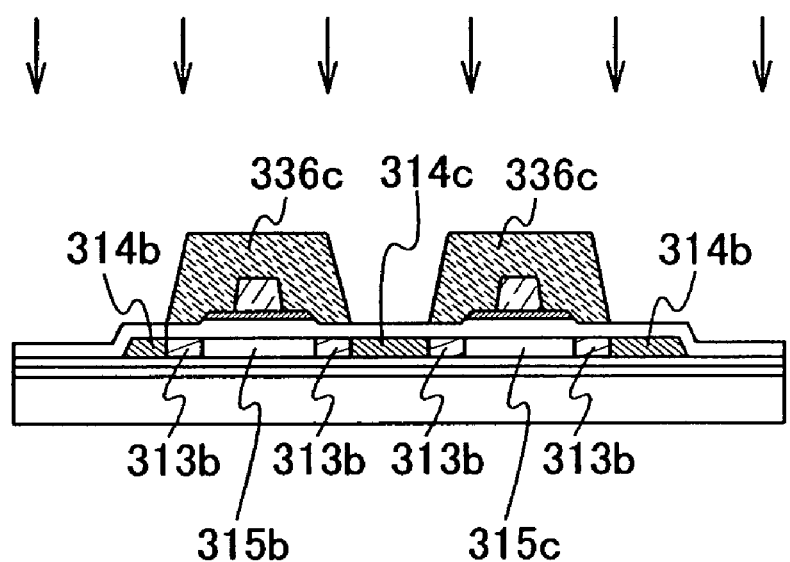
Figure 15C:
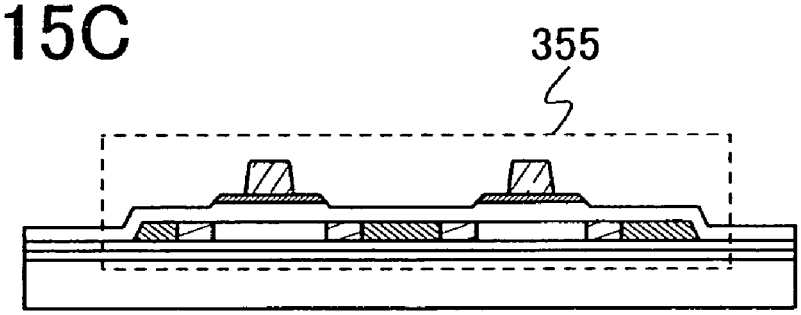

As shown in FIGS. 15A to 15C, when regions not overlapped with gate electrodes in first n-type impurity regions 312d (FIG. 15A) are partially covered with masks (FIG.

15B), second n-type impurity regions (low-concentration impurity regions) 313b, which have the same conductivity type as that of a third n-type impurity region 314b and a lower concentration than that of the third n-type impurity region 314b, are provided between the third n-type impurity region 314b serving as a source or a drain and a channel forming region 315b, between a high concentration impurity region 314c and the channel forming region 315b, between the high concentration impurity region 314c and a channel forming region 315c, and between the third n-type impurity region 314b and the channel forming region 315c. Accordingly, an n-channel transistor 355 which can reduce an off leak current can be obtained (FIG. 15C). It is to be noted that the high-concentration impurity region 314c has the same conductivity type and the same concentration as those of the third n-type impurity region 314b. In addition, in the transistor 355, gate electrodes 311f and 311g are electrically connected to each other so that the same voltage is applied at the same timing. The transistor 355 is a double gate transistor having two channel forming regions 315b and 315c.

After removing the masks 336a and 336b, a mask 337 covering the semiconductor film 306b is formed. By using the mask 337 and the third conductive layers 310a, and 310c to 310e as masks, an impurity element imparting p-type conductivity is added to the semiconductor films 306a ant 306c; therefore, first p-type impurity regions (low-concentration impurity regions) 316a and 316b are provided in regions overlapped with the first conductive layers 308a, and 308c to 308e respectively, and second p-type impurity regions 317a and 317b, and a high concentration impurity region 317c are provided in regions not overlapped with the first conductive layers 308a, 308c to 308e. The thus formed second p-type impurity regions 317a and 317b each serve as a source or a drain of a transistor, or have a function of connecting a transistor to a capacitor. It is to be noted that the high concentration impurity 317c has the same conductivity type and the same concentration as those of the second p-type impurity regions 317a and 317b. In such a manner, p-channel transistors 351 and 353, and a capacitor 354 can be obtained. It is to be noted that a region interposed between the first p-type impurity regions 316a of the transistor 351 serves as a channel forming region 318a. In addition, in the transistor 353, the gate electrodes 311c and 311d are electrically connected to each other so that the same voltage is applied at the same timing. The transistor 353 is a double gate transistor having two channel forming regions 318b and 318c. Further, when an impurity element imparting p-type conductivity is added in this step, an impurity element imparting p-type conductivity is added at a higher concentration than the impurity element contained in the first n-type impurity regions 312a and 312c which are formed beforehand; therefore, the n-type conductivity is lost (see FIG. 9B).

Next, the mask 337 is removed. As described above, a semiconductor device including the transistor 353 and the capacitor 354 used in a pixel portion 361, and the transistors 351 and 352 used in a driver circuit portion 362 can be manufactured (see FIG. 10A). The semiconductor device is provided with a terminal portion 363 for inputting a signal from outside through a subsequent step, in addition to the pixel portion 361 and the driver circuit portion 362. It is to be noted that a structure of the transistor is not particularly limited. For example, a double gate transistor having a structure in which a semiconductor film is interposed between two gate electrodes, a single drain transistor having a structure in which an impurity region serving as a source or a drain and a channel forming region are adjacent to each other (a region having a lower concentration than that of the impurity region serving as a source or a drain is not provided therebetween), or the like may be employed.

Then, first interlayer insulating films 319a, 319b, and 319c are sequentially formed so as to cover the transistors (see FIG. 10B). The first interlayer insulating films 319a to 319c can be formed using an insulating substance such as silicon oxide or silicon nitride. Here, each of silicon oxide and silicon nitride may contain nitrogen or oxygen. Further, in addition to an inorganic insulating substance such as silicon oxide or silicon nitride, one or more compounds of organic insulating substances such as acrylic or polyimide and siloxane (a compound containing a siloxane bond represented by —Si—O—Si— and having an organic group such as hydrogen or an alkyl group as a substituent) may be used.

A method for forming the first interlayer insulating films 319a to 319c is not particularly limited, and a plasma CVD method, a low pressure CVD method, a sputtering method, a PVD method, or the like may be used. In addition, in this embodiment mode, a multilayer film in which three layers, i.e. the first interlayer insulating films 319a, 319b, and 319c, are stacked, is employed. However, the number of stacked first interlayer insulating films is not particularly limited, and a single layer or a multilayer including two or more layers may be employed.

It is preferable that at least one of the first interlayer insulating films 319a, 319b, and 319c be an insulating film containing hydrogen. As the insulating film containing hydrogen, for example, an insulating film formed using silicon nitride, which is formed by using a $SiH_4$ gas, an $NH_3$ gas, an $N_2O$ gas, and an $H_2$ gas as a raw material gas by a plasma CVD method, can be given. The thus formed silicon nitride contains oxygen as well as hydrogen. When at least one of the first interlayer insulating films 319a, 319b, and 319c is to be an insulating film containing hydrogen, hydrogenation can be carried out to terminate a dangling bond contained in the island-shaped semiconductor films 306a to 306c by utilizing hydrogen contained in the insulating film. Therefore, for example, it is not necessary to carry out hydrogenation in an atmosphere where a furnace is filled with a hydrogen gas, and hydrogenation can be easily carried out.

In addition, when silicon nitride containing hydrogen is used as the first interlayer insulating film, a film formed using silicon oxide or silicon oxide containing nitrogen is preferably provided between the film formed using silicon nitride containing hydrogen and a transistor. As in this embodiment mode, when the first interlayer insulating film includes three layers, 319a, 319b, and 319c, the first interlayer insulating film 319a may be formed using silicon oxide or silicon oxide containing nitrogen, the first interlayer insulating film 319b may be formed using silicon nitride containing hydrogen (oxygen may be further contained), and the first interlayer insulating film 319c may be formed using silicon oxide or silicon oxide containing nitrogen.

In addition, when an organic insulating substance such as acrylic or polyimide or siloxane is used for the first interlayer insulating film, a film formed using an inorganic insulating substance such as silicon oxide or silicon nitride is preferably provided between the film formed using an organic insulating substance or siloxane and a transistor, or over the film formed using an organic insulating substance or siloxane. When the first interlayer insulating film is formed using an organic insulating substance or siloxane, planarity is improved, but water or oxygen is absorbed. In order to prevent this, a stacked layer structure with a film formed using an inorganic insulating substance is preferable.

In a caser where, for example, light emission from a light-emitting element is extracted to outside through the first interlayer insulating films 319a to 319c, the first interlayer insulating films 319a to 319 can be used to adjust a length of a light path through which light passes (see FIG. 10B).

It is to be noted that, before or after forming any of the first interlayer insulating films 319a, 319b, and 319, treatment for activating the impurity element imparting n-type or p-type conductivity, which is added beforehand, is preferably carried out. Treatment for activation is not particularly limited and may be carried out by using a furnace, RTA, laser light irradiation, or the like.

Subsequently, openings which reach the semiconductor films 306a to 306c are formed in the first interlayer insulating films 319a to 319. Further, after forming a conductive layer covering the openings and the first interlayer insulating film 319c, the conductive layer is processed into a desired shape. Thus, wirings 320f and 320g are formed in the pixel portion 361, wirings 320b, 320c, 320d, and 320e are formed in the driver circuit portion 362, and a wiring 320a is formed in the terminal portion 363, respectively (see FIG. 11A). A method for forming the openings is not particularly limited, and the openings may be formed by providing a mask formed of a resist or the like over the first interlayer insulating film 319c and then etching the first interlayer insulating films 319a to 319. Here, an etching method is not particularly limited, and either a wet etching method or a dry etching method may be used. In addition, the conductive layer may be a single layer or a multilayer, and it is preferable that at least one layer be formed using a metal having high conductivity such as aluminum or copper, or an alloy of aluminum and neodymium, or the like. Further, aluminum may contain silicon or the like. In a case of a multilayer, layers formed using metal nitride such as titanium nitride or tantalum nitride are preferably provided so as to interpose the layer containing a metal having high conductivity. A thickness of the conductive layer may be 500 nm to 2 μm, more preferably, 800 nm to 1 μm. It is to be noted that the wirings 320a to 320g include a conductive layer serving as a connection portion for electrically connecting a wiring or an electrode provided in a different layer.

Figure 11A:
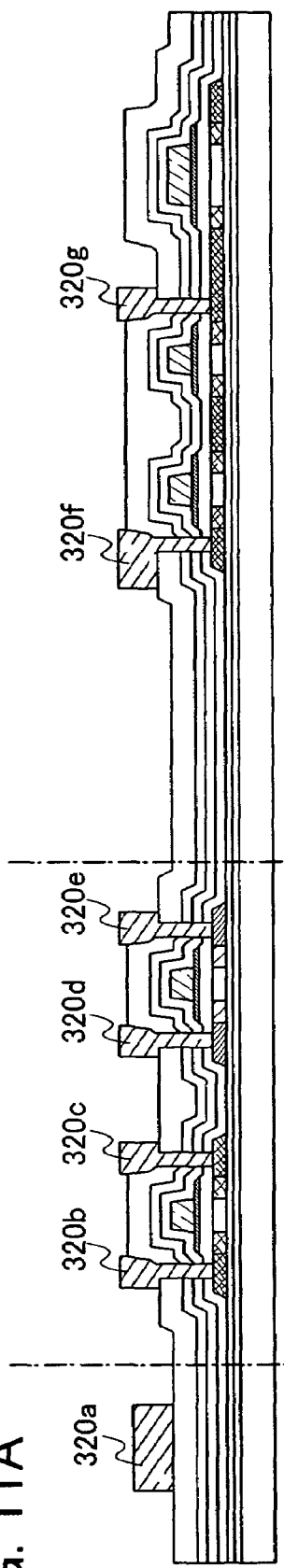
FIGS. 11A and 11B are views each showing one example of a manufacturing method of a light-emitting display device according to the present invention.
Figure 11B:
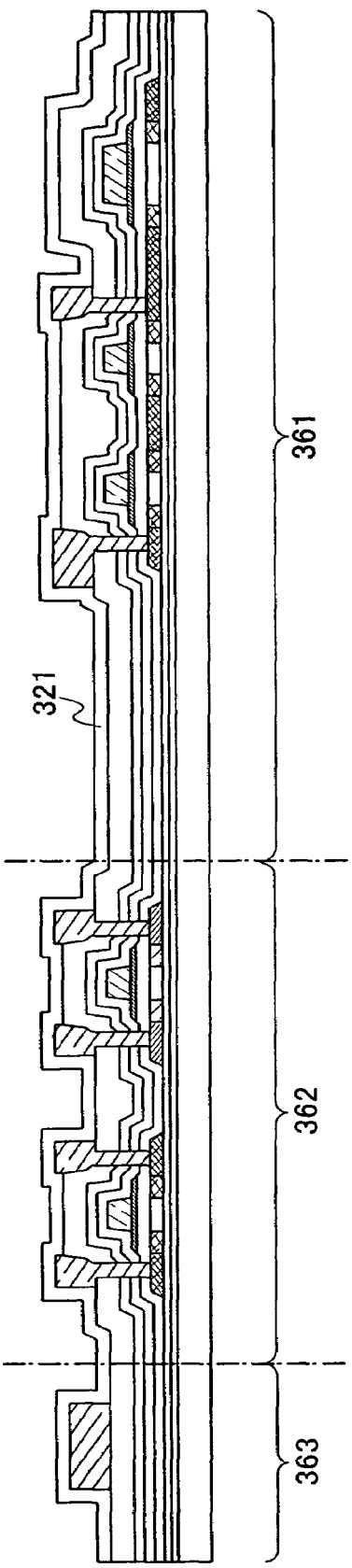

Next, a second interlayer insulating film 321 is formed so as to cover the wirings 320a to 320g (see FIG. 11B). The second interlayer insulating film 321 can be formed using an insulating substance such as silicon oxide or silicon nitride. Here, each of silicon oxide and silicon nitride may contain nitrogen or oxygen. Further, in addition to an inorganic insulating substance such as silicon oxide or silicon nitride, one or more compounds of organic insulating substances such as acrylic or polyimide and siloxane may be used. In addition, a method for forming the second interlayer insulating film 321 is not particularly limited, and a plasma CVD method, a low pressure CVD method, a sputtering method, a PVD method, or the like may be used. In addition, in this embodiment mode, the second interlayer insulating film 321 is a single layer, but a multilayer including two or more layers may be employed without being limited to the single layer. In a case where an organic insulating substance such as acrylic or polyimide, siloxane, or the like is used as the second interlayer insulating film 321, a stacked layer structure with an inorganic insulating film such as a silicon oxide film or a silicon nitride film is preferable.

Next, an opening which reaches the wiring 320f through the second interlayer insulating film 321 is formed, and the second interlayer insulating film 321 is etched so as to expose the wiring 320a (see FIG. 12A). Etching may be carried out by a wet etching method, a dry etching method, or the like after providing a mask formed of a resist or the like over the second interlayer insulating film 321.

Then, an electrode 322 of a light-emitting element is formed over the second interlayer insulating film 321 (see FIG. 12A). A material used for forming the electrode 322 of the light-emitting element is not particularly limited, and an oxide semiconductor such as indium tin oxide, indium zinc oxide, or zinc oxide, or a conductive material such as aluminum, gold, or platinum may be used. A method for forming the electrode 322 of the light-emitting element is not particularly limited either, and for example, a film may be formed using the oxide semiconductor or the conductive material over the second interlayer insulating film 321, a mask formed of a resist or the like may be provided over the film that is formed, and the film formed using the oxide semiconductor or the conductive material may be etched into a desired shape.

Then, an insulating film 323 covering an end portion of the electrode 322 of the light-emitting element is formed (see FIG. 12B). The insulating film 323 can be formed using an inorganic insulating substance such as silicon oxide or silicon nitride, an organic insulating substance such as acrylic, polyimide, or resist, siloxane, or the like. In particular, a photosensitive resin such as photosensitive acrylic, photosensitive polyimide, or resist is preferably used. When the insulating film 323 is formed using a photosensitive resin by photolithography so as to have a desired shape, the insulating film 323 can have an edge of a round shape, and consequently, deterioration of the light-emitting element can be reduced.

Figure 13A:
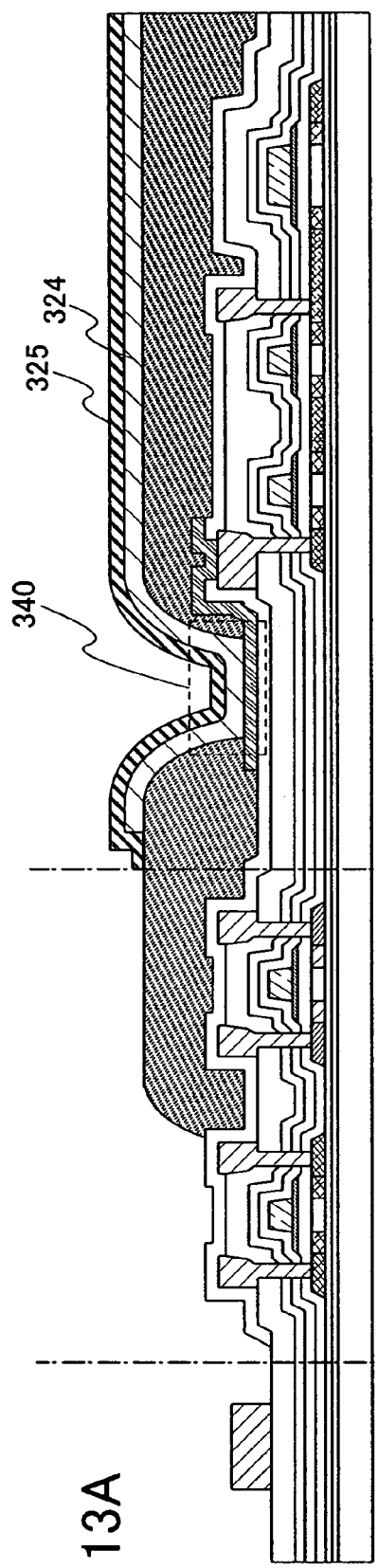
FIGS. 13A and 13B are views each showing one example of a manufacturing method of a light-emitting display device according to the present invention.

Subsequently, a light-emitting layer 324 is formed over the electrode 322 of the light-emitting element (see FIG. 13A). The light-emitting layer 324 may be formed by using either an organic substance or an inorganic substance, or both an organic substance and an inorganic substance. In addition, the light-emitting layer 324 may be a single layer or a multilayer having a hole-transporting layer, an electron transporting layer, a hole-injecting layer, an electron injecting layer, and the like in addition to a layer containing a substance which emits light of a desired wavelength (a light-emitting substance). In the case of a multilayer, over the electrode 322 of the light-emitting element, a layer formed using an organic substance having high conductivity such as PEDOT, a layer formed using a mixture of a substance having a high hole-transporting property and a substance showing an electron accepting property to the substance, or a layer formed using a mixture of a substance having a high electron-transporting property and a substance showing an electron donating property to the substance may be provided, and thereafter, other layers such as a layer containing a light-emitting substance, a hole transporting layer, and an electron transporting layer may be provided. As for the layer formed using an organic substance having high conductivity such as PEDOT, the layer formed using a mixture of a substance having a high hole-transporting property and a substance showing an electron accepting property to the substance, and the layer formed using a mixture of a substance having a high electron-transporting property and a substance showing an electron donating property to the substance, a drive voltage of the light-emitting element is hardly increased even when these layers are thickly made. Therefore, when these layers are thickly made, unevenness formed on the surface of the electrode 322 of the light-emitting element is relieved, thereby preventing a short-circuit or the like between electrodes of the light-emitting element. It is to be noted that the light-emitting substance may be a substance which emits fluorescence or a substance which emits phosphorescence.

The light-emitting layer 324 may be formed for each light-emitting element of a different emission color, or may be formed as one layer which emits the same emission color (such as white light emission). In the case of the same emission color, the light emitting element may be combined with a color filter or the like, and light emission extracted to outside a light-emitting display device may have a different color depending on the pixel.

Next, an electrode 325 of the light-emitting element is formed over the light-emitting layer 324. A material used for forming the electrode 325 of the light-emitting element is not particularly limited, and an oxide semiconductor such as indium tin oxide, indium zinc oxide, or zinc oxide, or a conductive material such as aluminum, gold, or platinum may be used. It is to be noted that at least one of the electrode 322 and the electrode 325 of the light-emitting element is formed using indium tin oxide, indium zinc oxide, zinc oxide, or the like so that light emission from the light-emitting layer 324 can be transmitted. In such a manner, a light-emitting element 340 including the electrode 322 of the light-emitting element, the light-emitting layer 324, and the electrode 325 of the light-emitting element is obtained (see FIG. 13A).

Figure 13B:
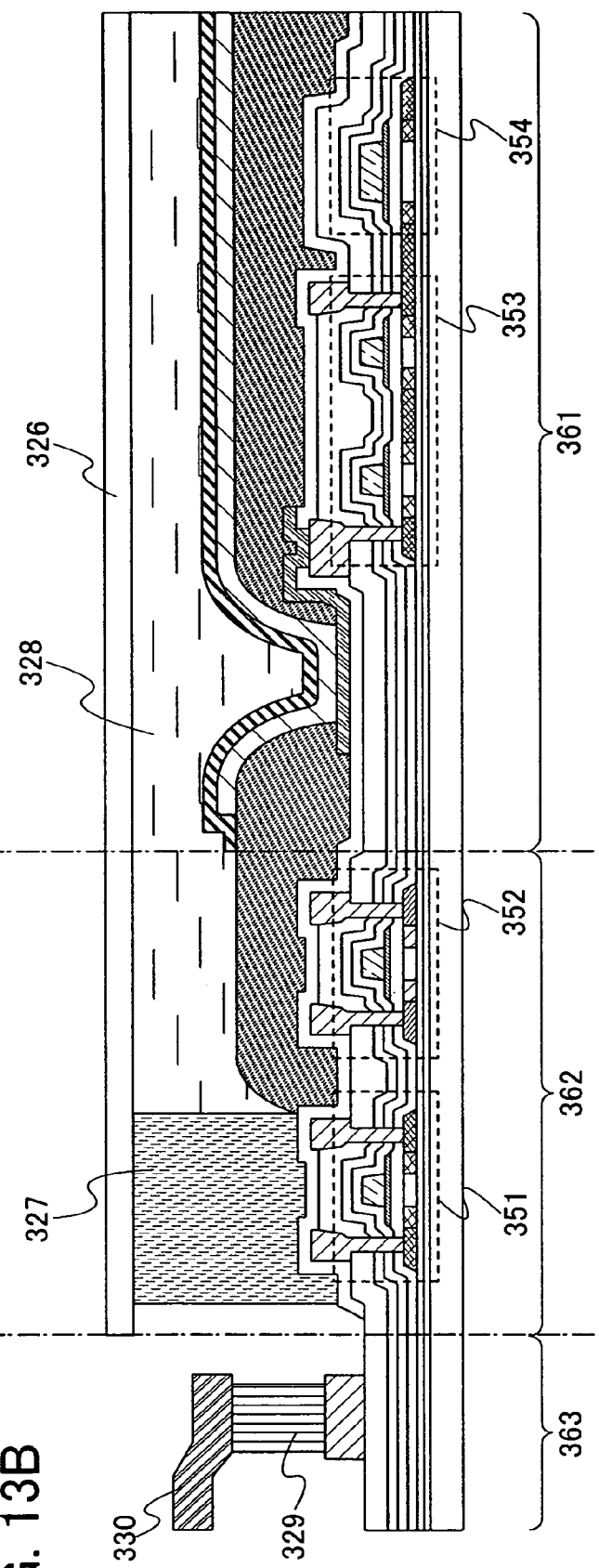
Figure 14:
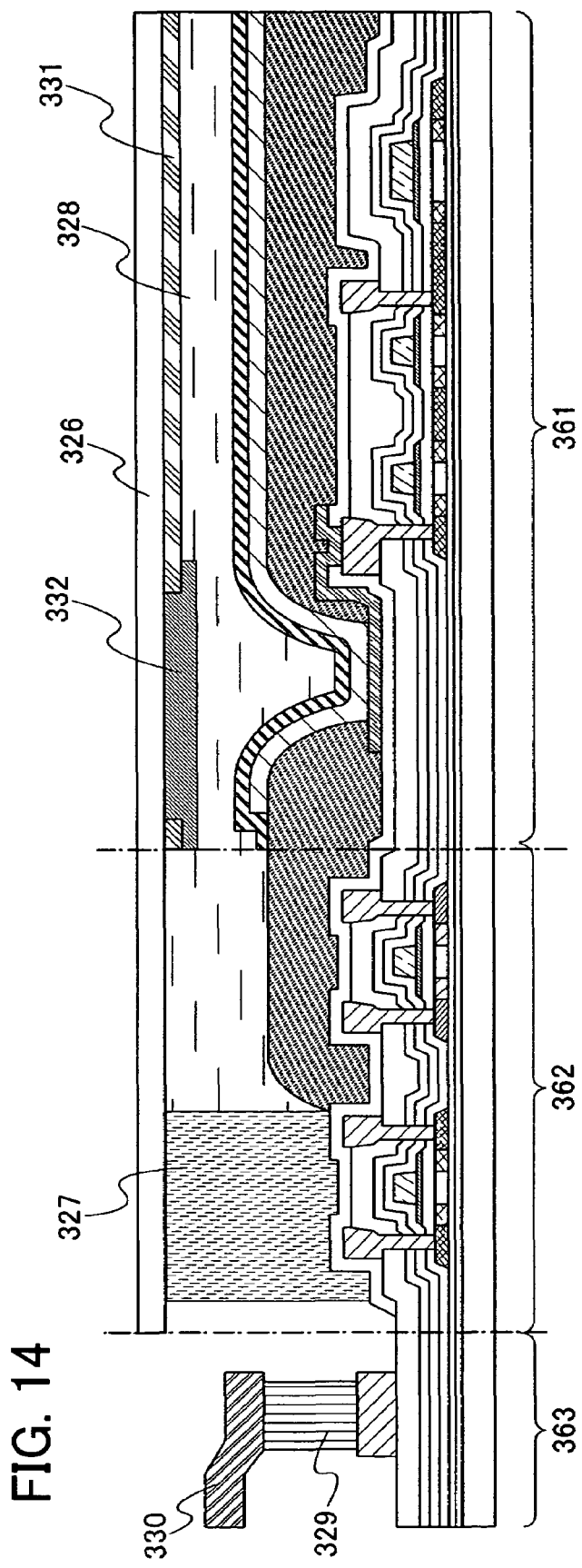
FIG. 14 is a view showing one example of a manufacturing method of a light-emitting display device according to the present invention.

Then, the substrate 300 and a substrate 326 are attached to each other by using a sealing material 327 so that the transistors 351 to 353 and the light-emitting element 340 which are formed beforehand are sealed (see FIG. 13B). As shown in FIG. 14, the substrate 326 may be provided with a light-shielding layer 331 and a color filter 332. Further, a space 328 sealed with the substrate 300 and the substrate 326 may be filled with an inert gas such as nitrogen or argon, or filled with a resin material or the like. The resin material that is filled may contain a drying agent.

It is to be noted that the substrate 326 is not particularly limited, and a glass substrate, a plastic substrate (polyimide, acrylic, polyethylene terephthalate, polycarbonate, polyarylate, polyethersulfone, or the like), or the like can be used. In addition, when light emission is extracted using a surface opposite to the substrate 326 side (the substrate 300 side) as a display surface, a ceramic substrate, a metal substrate (tantalum, tungsten, molybdenum, or the like), a substrate obtained by forming an insulating film over a surface of a stainless steel substrate, or the like can be used in addition to the above substrates.

Then, an FPC (flexible printed circuit) 330 is connected to the wiring 320a by using a conductive adhesive 329 or the like (see FIG. 13B).

As described above, a light-emitting display device including a semiconductor device according to the present invention can be manufactured. In this embodiment mode, a method for manufacturing a light-emitting display device is described, but a liquid crystal display device or the like can be manufactured by appropriately changing a step after the step of forming the electrode 322 of the light-emitting element and a circuit configuration.

Further, in this embodiment mode, a method for manufacturing a driver circuit portion and a pixel portion using a transistor over the same substrate is described, but the present invention is not limited thereto. A structure using an external driver circuit portion including an IC chip may also be employed.

As described above, when a crystalline semiconductor film in which pin holes are reduced according to the present invention is used, a defect of a gate insulating film of a semiconductor device that is formed can be prevented. Therefore, a display device with improved operating characteristics and reliability can be manufactured.

Embodiment Mode 3

One mode of a pixel portion of a light-emitting display device which is manufactured by the manufacturing method described in Embodiment Modes 1 and 2 will be described with reference to a top view of FIG. 16.

Figure 16:
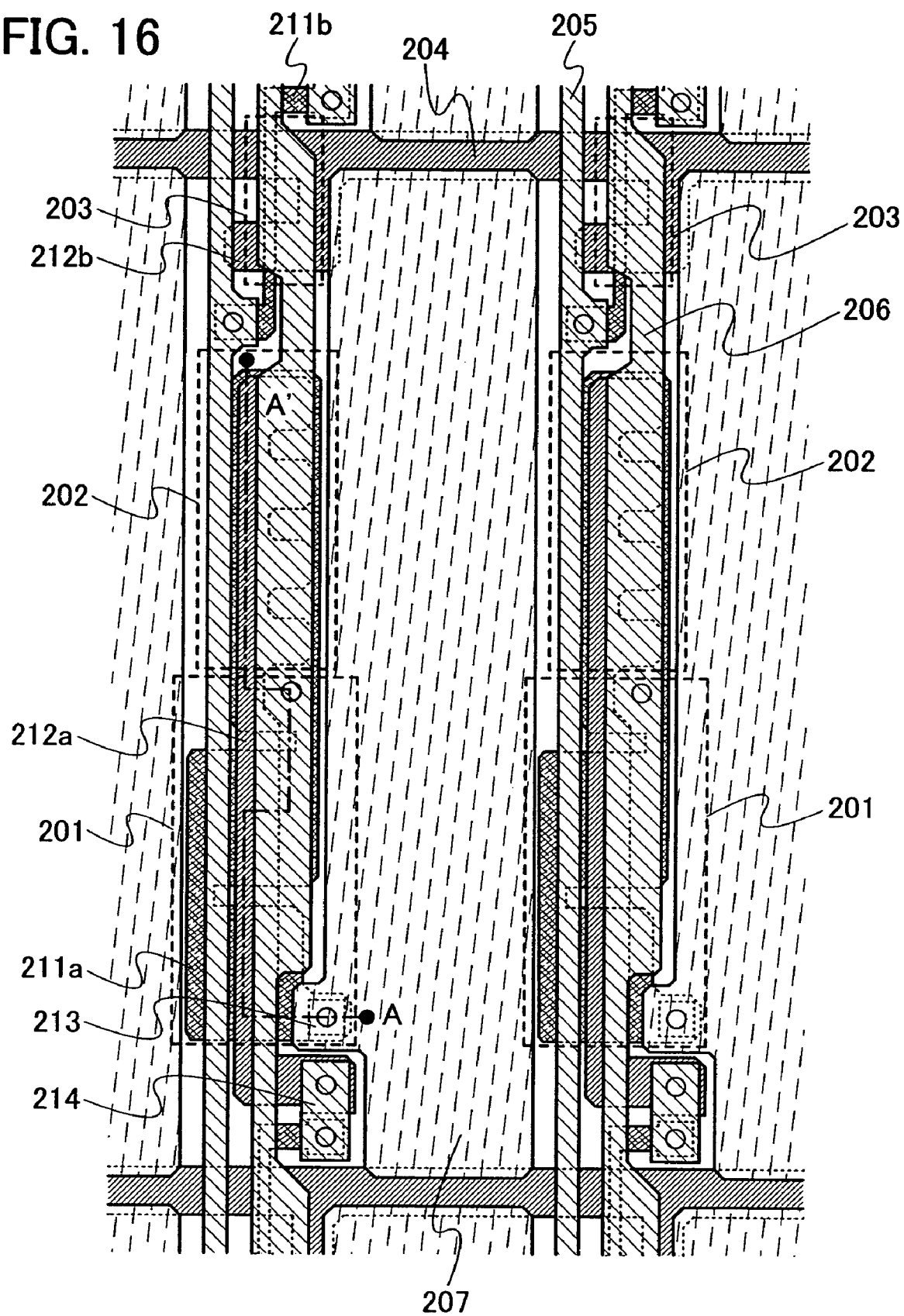
FIG. 16 is a top view showing one example of a pixel portion of a light-emitting display device according to the present invention.

A cross-section taken along a dashed line A-A' in FIG. 16 corresponds to a cross-sectional view of the pixel portion 361 in FIG. 13B. In FIG. 16, the insulating film 323 covering an end portion of the electrode 322 of the light-emitting element, the light-emitting layer 324, the electrode 325 of the light-emitting element, the substrate 326, and the like are not shown; however, they are provided in a practical case.

It is understood from FIG. 16 that a semiconductor film 211a overlaps with a first conductive layer 212a including a region serving as a gate electrode and a capacitor electrode, and a transistor 201 corresponding to the transistor 353 in FIG. 13B and a capacitor 202 corresponding to the capacitor 354 are provided. The first conductive layer 212a is connected to an electrode 207 of a light-emitting element (corresponding to the electrode 322 of the light-emitting element of FIG. 13B) through a second conductive layer 213. In addition, a gate line 204 is formed in the same layer as the first conductive layer 212a.

Further, a source line 205 and a current supply line 206 are provided so as to intersect with the gate line 204. The source line 205 is connected to a source of a transistor 203 including a semiconductor film 211b and a third conductive layer 212b. It is to be noted that the transistor 355 of FIG. 15C corresponds to the transistor 203. The third conductive layer 212b is provided in the same layer as the gate line 204 and the first conductive layer 212a and connected to the gate line 204. In addition, part of the gate line 204 is provided so as to serve as a gate electrode of the transistor 203.

The current supply line 206 is connected to the semiconductor film 211a so that a current is supplied to the light-emitting element when the transistor 201 is turned on. It is to be noted that, in this embodiment mode, components may also be electrically connected to each other through another conductive layer as in a case where the semiconductor film 211b and the first conductive layer 212a are connected to each other through a forth conductive layer 214. Further, in this embodiment mode, a portion of the first conductive layer 212a, which serves as an electrode of the capacitor 202, has an uneven sawtooth-shape. By such a shape, electric charges are easily accumulated in the capacitor 202.

Figure 17:
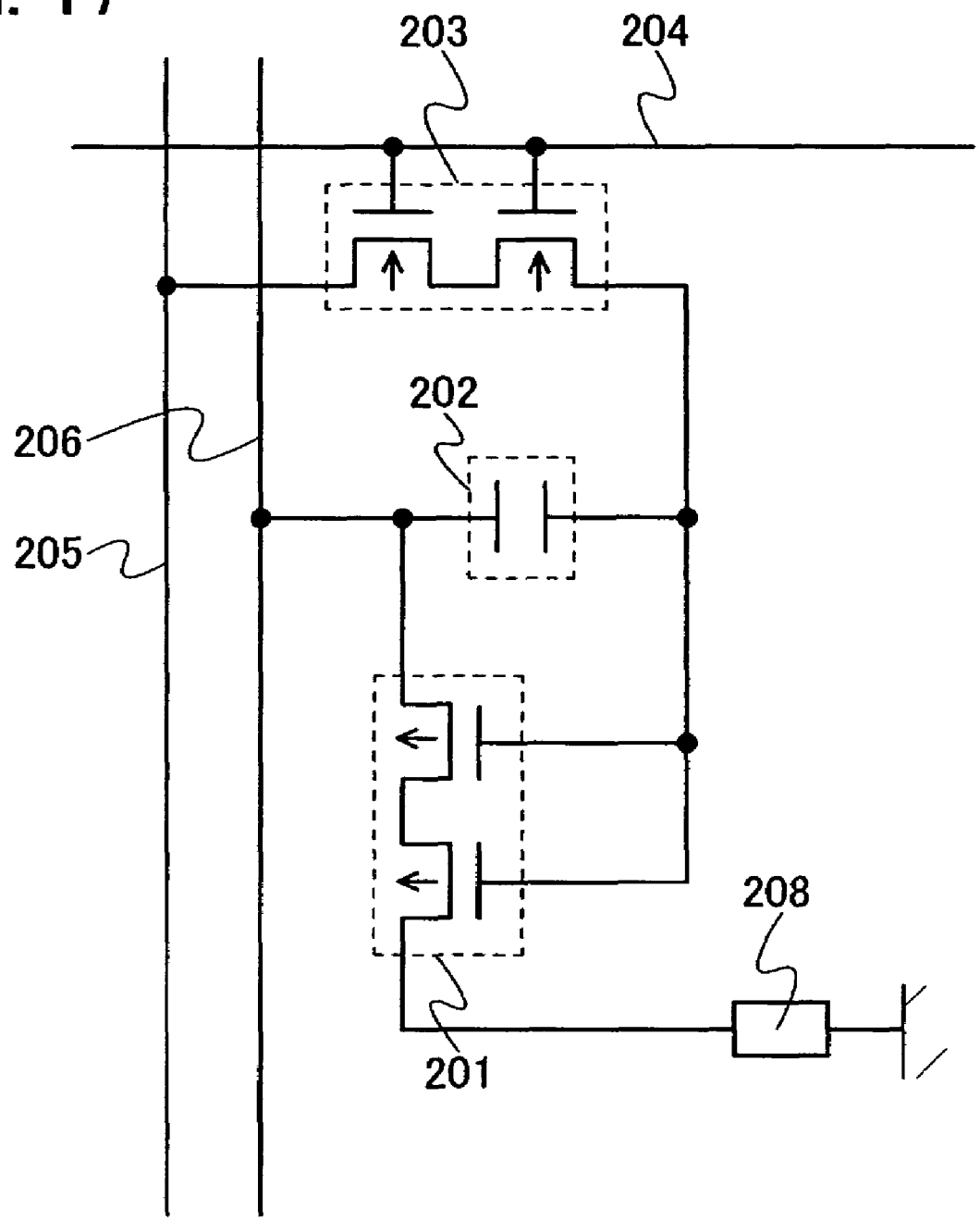
FIG. 17 is a diagram showing one example of an equivalent circuit of a pixel portion of a light-emitting display device according to the present invention.

The transistors 201 and 203, the capacitor 202, the gate line 204, the source line 205, and the current supply line 206 are connected as shown in a circuit diagram of FIG. 17. It is to be noted that a light-emitting element 208 includes the electrode 207 of the light-emitting element of FIG. 16. The light-emitting element 208 is a diode type element. In a case where the transistor 201 connected in series to the light-emitting element 208 is a p-channel transistor as in this embodiment mode, the electrode 207 of the light-emitting element serves as an anode. On the other hand, in a case where the transistor 201 is an n-channel transistor, the electrode 207 of the light-emitting element serves as a cathode.

In FIG. 17, the transistor 201 is a p-channel transistor and the transistor 203 is an n-channel transistor: however, the present invention is not limited thereto, and the transistor 201 may be an n-channel transistor and the transistor 203 may be a p-channel transistor. Alternatively, both the transistor 201 and the transistor 203 may be n-channel transistors, or both the transistor 201 and the transistor 203 may be p-channel transistors.

In a pixel portion of a light-emitting display device according to the present invention, a plurality of light-emitting elements, which are driven by a circuit as shown in FIG. 17, are provided in a matrix. A circuit for driving a light-emitting element is not limited to the circuit shown in FIG. 17, and for example, a circuit having a configuration provided with an erasing transistor, which is used for an erasing line and erasing operation to forcibly erase an inputted signal, or the like may also be employed. In addition, as for the top view of the pixel portion shown in FIG. 16, a wiring and the like are appropriately changed depending on a layout.

When a pixel portion is provided with a semiconductor device using a crystalline semiconductor film in which pin holes are reduced according to the present invention, a display device with improved operating characteristics and reliability and having a high-definition pixel portion can be obtained.

Embodiment Mode 4

A module using a panel including a light-emitting display device which is manufactured by the manufacturing method described in Embodiment Modes 1 and 2 will be described with reference to FIGS. 18A and 18B.

Figure 18A:
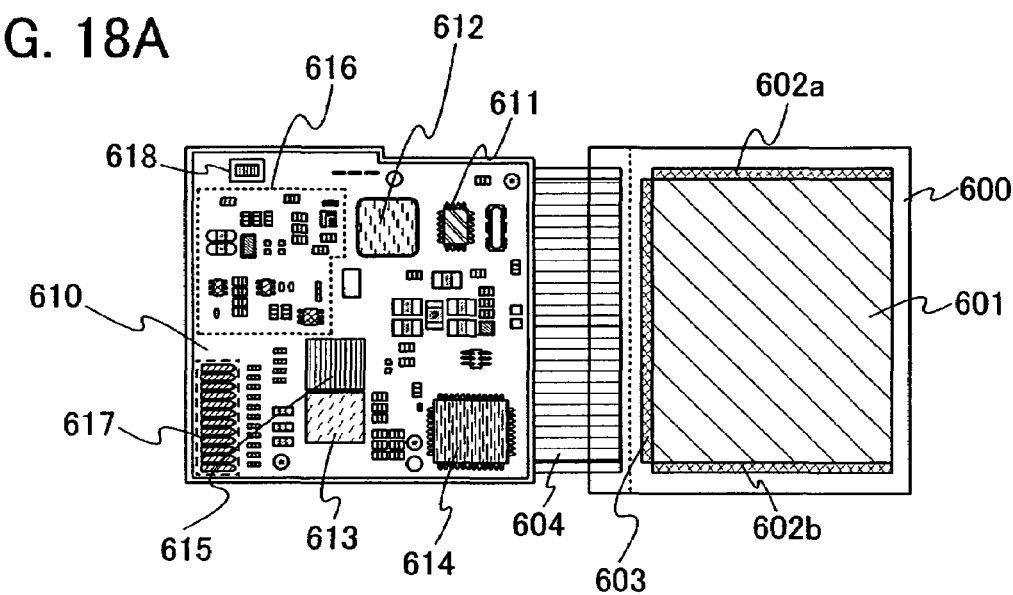
FIGS. 18A and 18B are views each showing an example of a panel provided with a semiconductor device according to the present invention.

FIG. 18A shows a module of an information terminal. A panel 600 is provided with a pixel portion 601 having a light-emitting element in each pixel, a first scanning line driver circuit 602a and a second scanning line driver circuit 602b which select a pixel included in the pixel portion 601, and a signal line driver circuit 603 which supplies a video signal to the selected pixel. The pixel portion 601 corresponds to the pixel portion 361 in FIG. 13B, the pixel portion explained in the top view of FIG. 16, or the like.

A printed wiring board 610 is connected to the panel 600 through an FPC (flexible printed circuit) 604. On the printed wiring board 610, a controller 611, a CPU (central processing unit) 612, a memory 613, a power supply circuit 614, an audio processing circuit 615, a transmission/reception circuit 616, and other elements such as a resistor, a buffer, and a capacitor are mounted.

Various control signals are inputted and outputted through an interface (I/F) portion 617 provided over the printed wiring board 610. An antenna port 618 for transmitting and receiving signals to/from an antenna is provided over the printed wiring board 610.

It is to be noted that, in this embodiment mode, the printed wiring board 610 is connected to the panel 600 through the FPC 604; however, the present invention is not limited thereto. The controller 611, the audio processing circuit 615, the memory 613, the CPU 612, or the power supply circuit 614 may be directly mounted on the panel 600 by a COG (Chip on Glass) method. In addition, various elements such as a capacitor and a buffer provided over the printed wiring board 610 prevent a noise in a power supply voltage or a signal and a rounded rise of a signal.

Figure 18B:
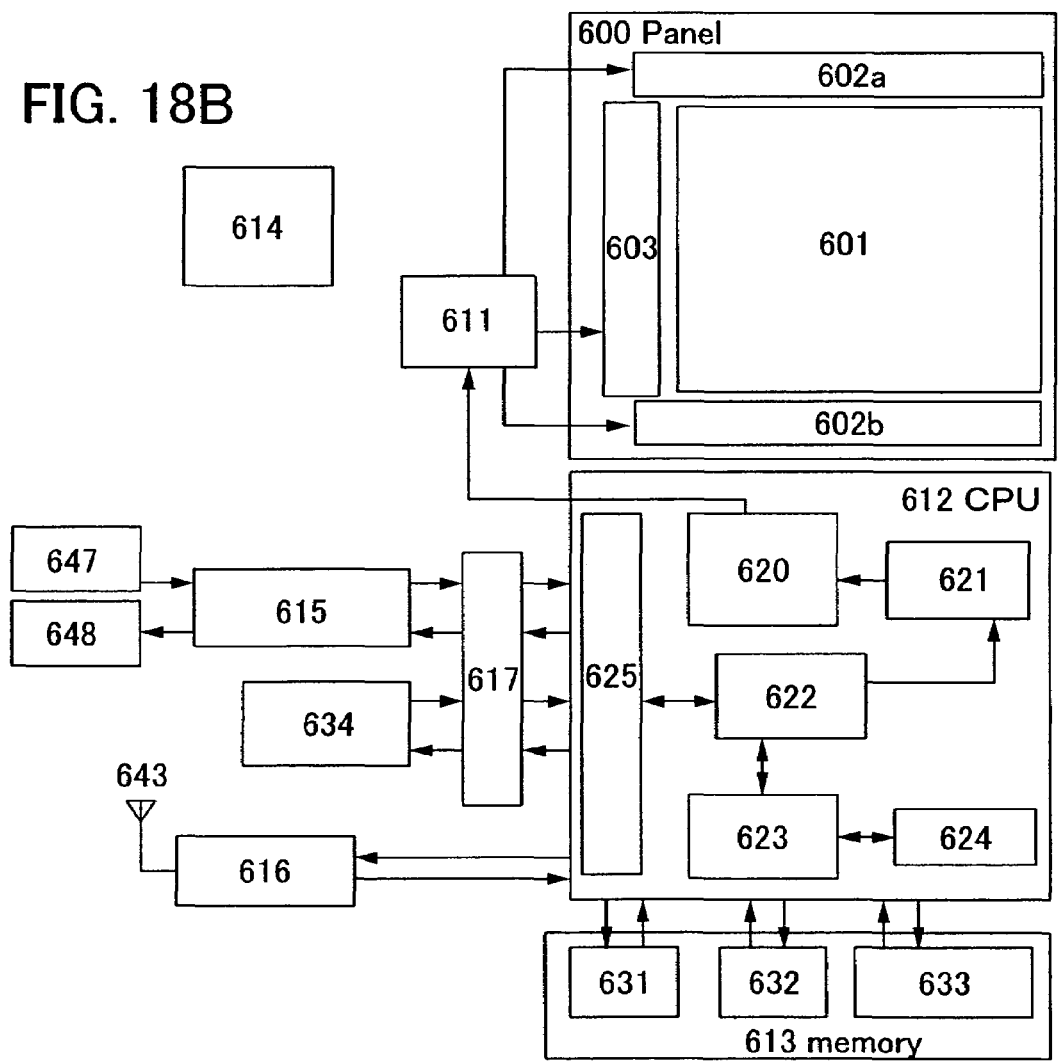

FIG. 18B shows a block diagram of the module shown in FIG. 18A. The module includes, as the CPU 612, a control signal generating circuit 620, a decoder 621, a register 622, an arithmetic circuit 623, a RAM 624, an interface 625 for the CPU, and the like. Various signals inputted to the CPU 612 through the interface 625 are inputted to the arithmetic circuit 623, the decoder 621, and the like after being once held in the register 622. The arithmetic circuit 623 operates based on the inputted signal and specifies an address to send various instructions. Meanwhile, a signal inputted to the decoder 621 is decoded and inputted to the control signal generating circuit 620. The control signal generating circuit 620 generates a signal including various instructions based on the inputted signal and sends it to the address specified by the arithmetic circuit 623, which is specifically the memory 613, the transmission/reception circuit 616, the audio processing circuit 615, the controller 611, or the like.

As the memory 613, a VRAM 631, a DRAM 632, a flash memory 633, and the like are provided. The VRAM 631 stores image data displayed on the panel 600, the DRAM 632 stores image data or audio data, and the flash memory 633 stores various programs.

The power supply circuit 614 generates a power supply voltage applied to the panel 600, the controller 611, the CPU 612, the audio processing circuit 615, the memory 613, and the transmission/reception circuit 616. Moreover, depending on the specifications of the panel, a current source is provided in the power supply circuit 614 in some cases.

The memory 613, the transmission/reception circuit 616, the audio processing circuit 615, and the controller 611 operate in accordance with respective received instructions. The operations will be briefly described below.

A signal inputted from an input unit 634 is transmitted to the CPU 612 mounted on the printed wiring board 610 through the interface (I/F) portion 617. The control signal generating circuit 620 converts the image data stored in the VRAM 631 into a predetermined format in accordance with the signal transmitted from the input unit 634 such as a pointing device or a keyboard, and then transmits it to the controller 611.

The controller 611 processes a signal including the image data transmitted from the CPU 612 in accordance with the specifications of the panel and supplies it to the panel 600. The controller 611 generates and sends a Hsync signal, a Vsync signal, a clock signal CLK, an alternating-current voltage (AC Cont), and a switching signal L/R to the panel 600 based on the power supply voltage inputted from the power supply circuit 614 or various signals inputted from the CPU 612

In the transmission/reception circuit 616, a signal transmitted and received as an electric wave by an antenna 643 is processed. Specifically, high frequency circuits such as an isolator, a band path filter, a VCO (Voltage Controlled Oscillator), an LPF (Low Pass Filter), a coupler, and a balan are included. Among the signals transmitted and received by the transmission/reception circuit 616, signals including audio data are transmitted to the audio processing circuit 615 in accordance with an instruction transmitted from the CPU 612.

The signals including audio data transmitted in accordance with the instruction from the CPU 612 are demodulated into audio signals in the audio processing circuit 615 and transmitted to a speaker 648. The audio signal transmitted from a microphone 647 is modulated in the audio processing circuit 615 and transmitted to the transmission/reception circuit 616 in accordance with the instruction from the CPU 612.

The controller 611, the CPU 612, the power supply circuit 614, the audio processing circuit 615, and the memory 613 can be incorporated as a package of the printed wiring board 610. This embodiment mode can be applied to any circuit besides high frequency circuits such as an isolator, a band path filter, a VCO (Voltage Controlled Oscillator), an LPF (Low Pass Filter), a coupler, and a balan.

When a display panel or a driver circuit described in this embodiment mode is provided with a semiconductor device using a crystalline semiconductor film in which pin holes are reduced according to the present invention, a module with a high-definition display panel and high reliability can be obtained.

Embodiment Mode 5

Figure 19:
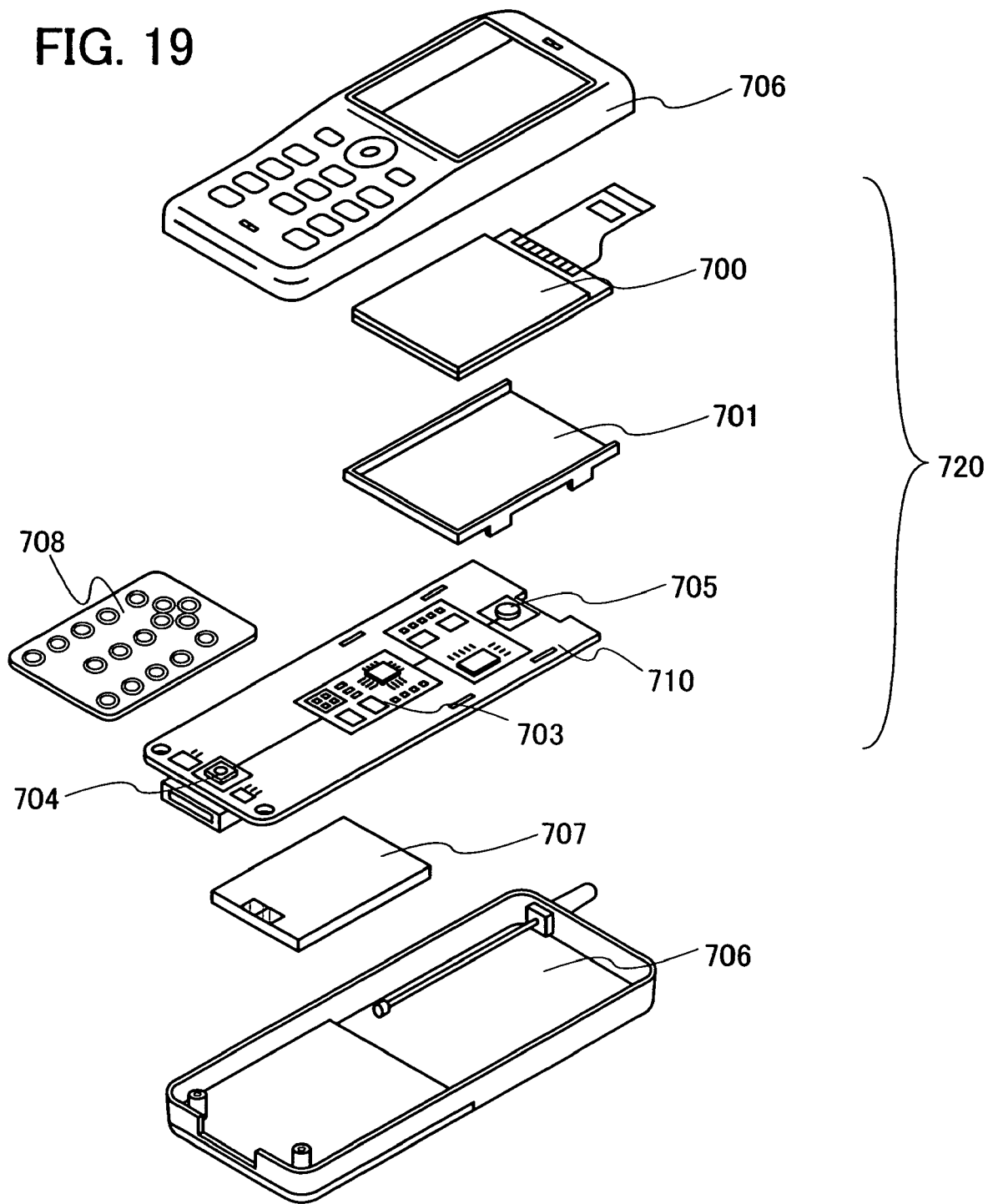
FIG. 19 is a view showing an example of an electronic device provided with a semiconductor device according to the present invention.

This embodiment mode will be described with reference to FIGS. 18A and 18B, and 19. FIG. 19 shows one mode of a compact phone (mobile phone), which operates wirelessly, can be carried about, and includes a module using a panel having a semiconductor device and a light-emitting display device according to the present invention. A display panel 700 is detachably incorporated in a housing 701 so as to be easily fixed to a printed wiring board 710. The housing 701 can be appropriately changed in shape and size in accordance with an electronic device into which the housing 701 is incorporated.

In FIG. 19, the housing 701, to which the display panel 700 (corresponding to the panel 600 in FIGS. 18A and 18B) is fixed, is fitted to the printed wiring board 710 (corresponding to the printed wiring board 610 in FIGS. 18A and 18B) and set up as a module. On the printed wiring board 710, a controller, a CPU, a memory, a power supply circuit, and other elements such as a resistor, a buffer, and a capacitor are mounted. Moreover, an audio processing circuit including a microphone 704 and a speaker 705 and a signal processing circuit 703 such as a transmission/reception circuit are provided. The display panel 700 is connected to the printed wiring board 710 through an FPC as explained in FIGS. 18A and 18B.

Such a module 720, an input unit 708, and a battery 707 are stored in a chassis 706. A pixel portion of the display panel 700 is arranged so that it can be seen through a window formed in the chassis 706.

The chassis 706 shown in FIG. 19 shows an exterior shape of a phone as an example. However, the present invention is not limited thereto, and has various modes in accordance with functions and applications.

The compact phone (mobile phone) described in this embodiment mode is provided with a semiconductor device using a crystalline semiconductor film in which pin holes are reduced according to the present invention in a display panel or a printed wiring board. Therefore, a module with a high-definition display panel and high reliability can be obtained.

Embodiment Mode 6

In Embodiment Mode 5, as an electronic device including a semiconductor device and a light-emitting display device according to the present invention, a compact phone (mobile phone) is described. This embodiment mode will describe other electronic devices: a camera such as a video camera or a digital camera, a goggle type display (a head mounted display), a navigation system, an audio reproducing device (such as a car stereo or an audio component), a notebook personal computer, a game machine, a portable information terminal (such as a mobile computer, a mobile phone, a portable game machine, or an electronic book), an image reproducing device provided with a recording medium (specifically, a device which reproduces a recording medium such as a DVD (Digital Versatile Disc) and has a display capable of displaying the reproduced image), and the like.

Figure 20A:
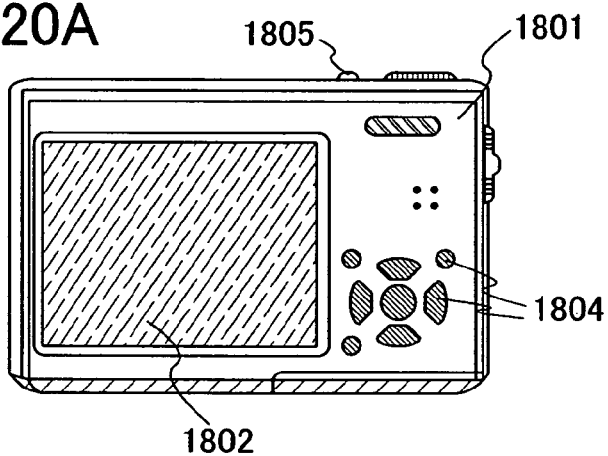
FIGS. 20A to 20D are views each showing an example of an electronic device provided with a semiconductor device according to the present invention.

FIG. 20A illustrates a digital camera including a main body 1801, a display portion 1802, an imaging portion, operating keys 1804, a shutter 1805, and the like. It is to be noted that FIG. 20A is a view of the display portion 1802 side, and the imaging portion is not shown. By using a semiconductor device and a light-emitting display device according to the present invention, a digital camera with a high-definition display portion and high reliability can be achieved.

Figure 20B:
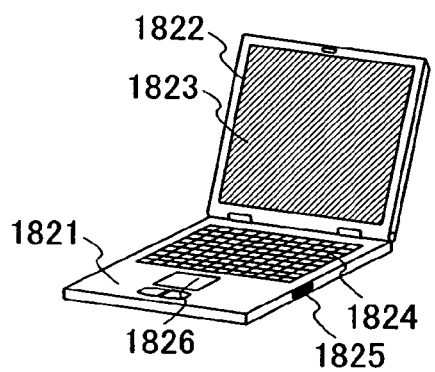

FIG. 20B illustrates a notebook personal computer including a main body 1821, a chassis 1822, a display portion 1823, a keyboard 1824, an external connection port 1825, a pointing mouse 1826, and the like. By using a semiconductor device and a light-emitting display device according to the present invention, a notebook personal computer with a high-definition display portion and high reliability can be achieved.

Figure 20C:
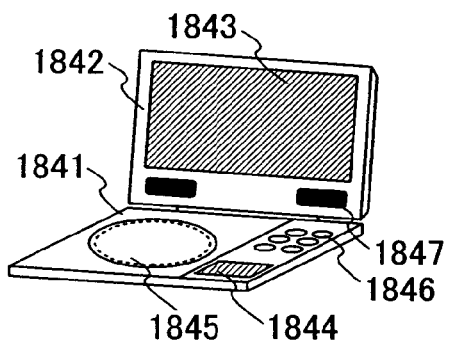

FIG. 20C illustrates a portable image reproducing device provided with a recording medium (specifically a DVD reproducing device), including a main body 1841, a chassis 1842, a display portion A 1843, a display portion B 1844, a recording medium (DVD or the like) reading portion 1845, an operating key 1846, a speaker portion 1847, and the like. The display portion A 1843 mainly displays image data while the display portion B 1844 mainly displays text data. It is to be noted that an image reproducing device provided with a recording medium also includes a home game machine and the like. By using a semiconductor device and a light-emitting display device according to the present invention, an image reproducing device with a high-definition display portion and high reliability can be achieved.

Figure 20D:
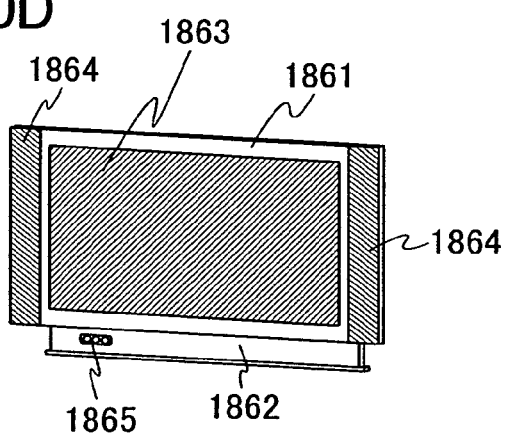

FIG. 20D illustrates a display device including a chassis 1861, a supporting stand 1862, a display portion 1863, a speaker 1864, a video input terminal 1865, and the like. The display device is manufactured by using a semiconductor device formed by the manufacturing method described in the above embodiment modes in the display portion 1863 and a driver circuit. It is to be noted that the display device includes a liquid crystal display device, a light-emitting display device, and the like, specifically includes all display devices for information display, for example, for a personal computer, for TV broadcast reception, or for advertisement display. By the present invention, a large-sized display device with a high-definition display portion, high reliability, and particularly, a large screen of 22 to 50 inches can be achieved.

As described above, various electronic devices with high reliability, which are provided with a semiconductor device and a light-emitting display device according to the present invention, can be achieved.

Embodiment 1

Figure 21:
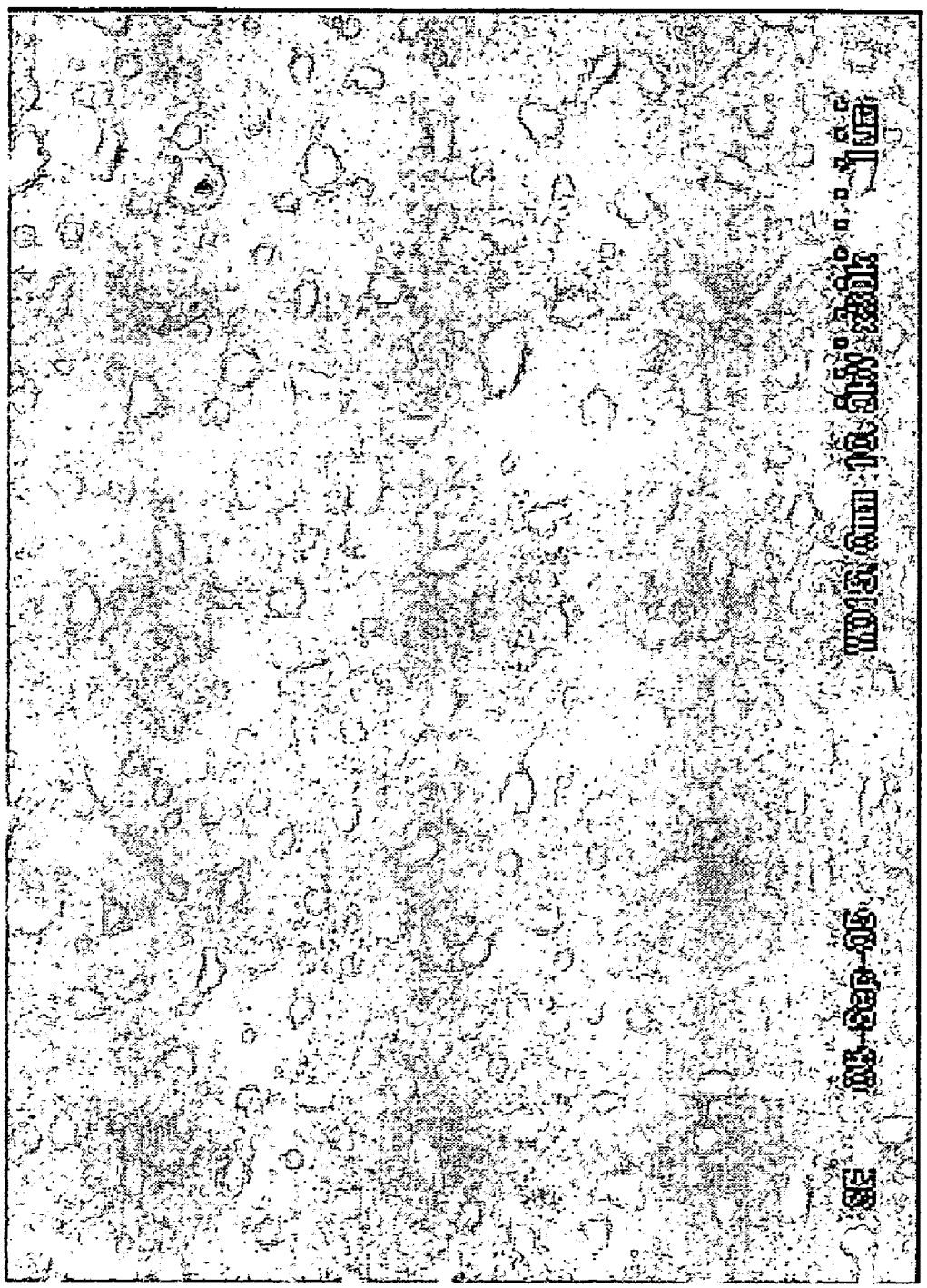
FIG. 21 is a SEM photograph showing a surface of a crystalline silicon film.
Figure 22:
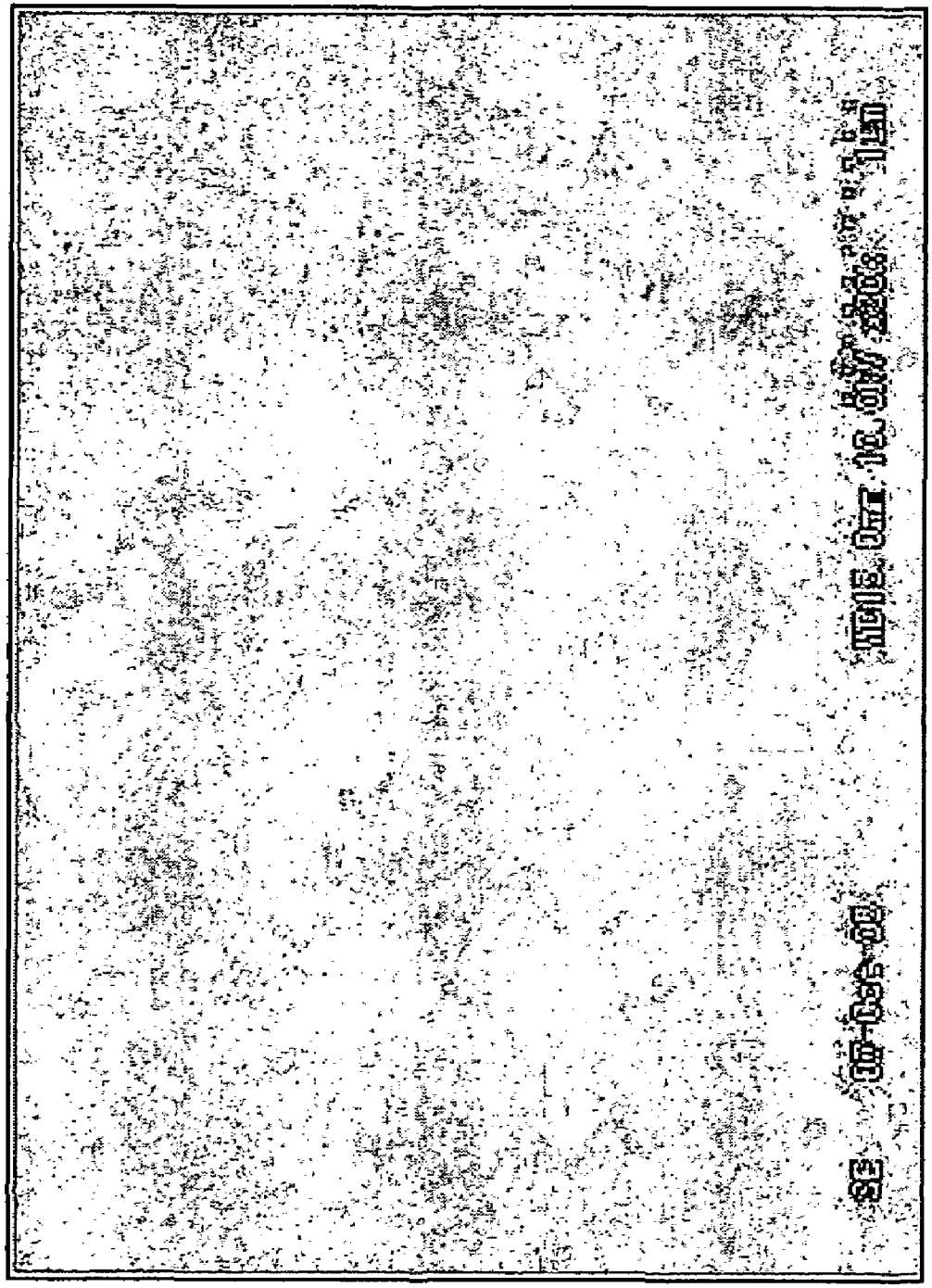
FIG. 22 is a SEM photograph showing a surface of a crystalline silicon film.
Figure 23:
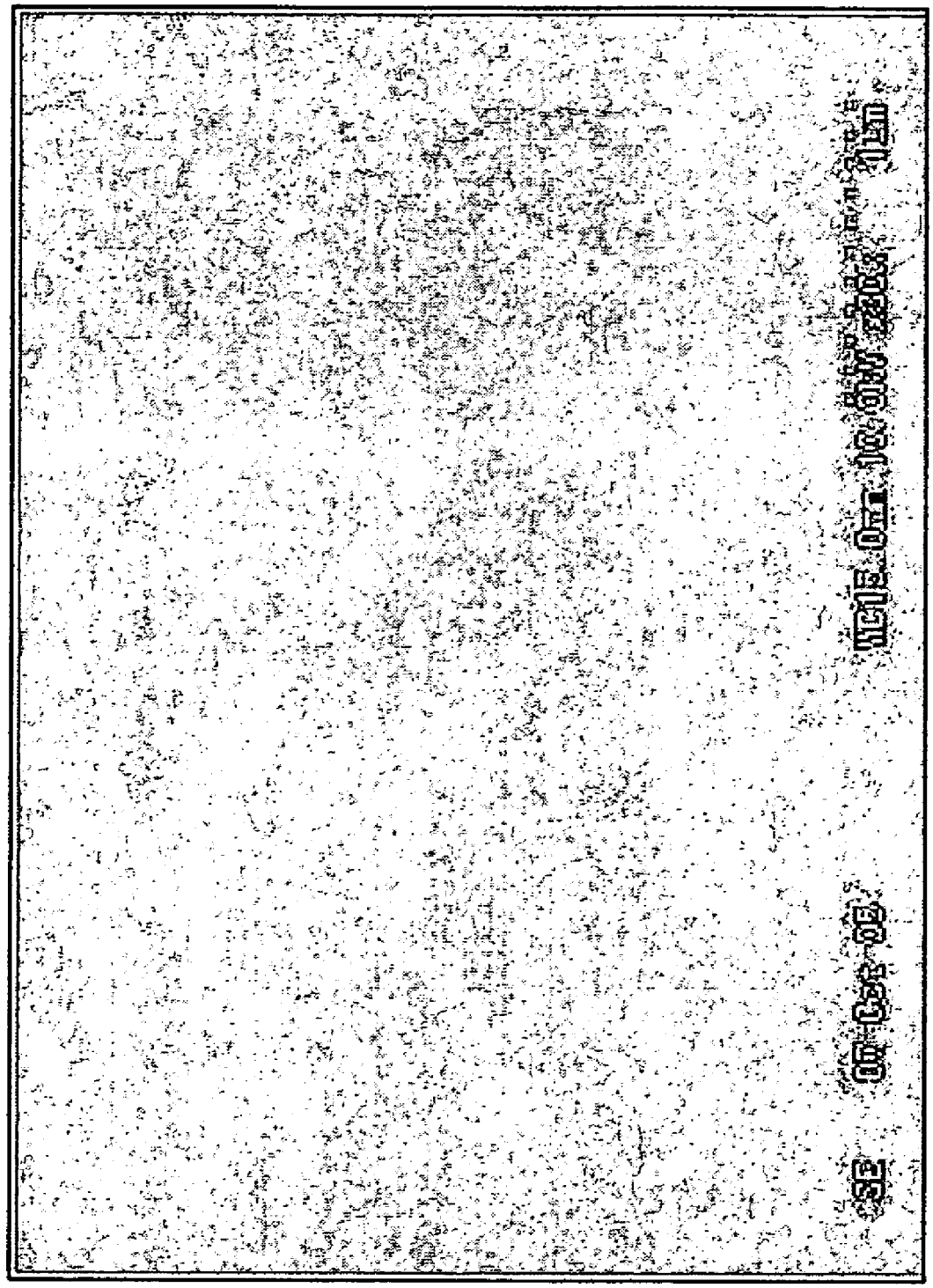
FIG. 23 is a SEM photograph showing a surface of a crystalline silicon film.

This embodiment will describe a crystalline semiconductor film which is manufactured by using the present invention. It is to be noted that each of photographs in FIGS. 21 to 23 is a SEM photograph in which a surface of a crystalline semiconductor film is enlarged (at 30000-fold magnification). Hereinafter, a manufacturing method of a crystalline semiconductor film in each of the photographs in FIGS. 21 to 23 will be briefly described.

FIG. 21 will be explained. First, an amorphous silicon film formed over an insulating substrate was doped with a metal element which promotes crystallization such as nickel and was crystallized by heat treatment. Next, an oxide film such as a natural oxide film formed over a crystallized silicon film (crystalline silicon film) was removed by using hydrofluoric acid. Then, the crystalline silicon film was irradiated with laser light. Energy density of the laser light was higher than or equal to 350 mJ/cm$^2$ and lower than or equal to 400 mJ/cm$^2$, and 11.6 shots of irradiation were performed at an arbitrary point of the crystalline silicon film. Next, a semiconductor film containing a rare gas element such as Ar was formed over the crystalline silicon film with an oxide film such as a natural oxide film interposed therebetween. By heat treatment, the metal element was gettered to the semiconductor film containing a rare gas element, and the metal element in the crystalline silicon film was reduced or removed. Then, the semiconductor film containing a rare gas element was removed by etching with an alkaline solution such as TMAH, and the oxide film was subsequently removed by using an hydrofluoric acid based solution. The crystalline silicon film manufactured up to here is referred to as a sample A. FIG. 21 shows a SEM photograph of the surface of the manufactured crystalline silicon film (sample A).

Subsequently, FIG. 22 will be explained. First, an amorphous silicon film formed over an insulating substrate was doped with a metal element which promotes crystallization such as nickel and was crystallized by heat treatment. Next, an oxide film such as a natural oxide film formed over a crystallized silicon film (crystalline silicon film) was removed by using hydrofluoric acid, and immediately thereafter, the surface of the crystalline silicon film was treated with an ozone-containing aqueous solution to form a new oxide film. Then, the crystalline silicon film was irradiated with first laser light. Energy density of the first laser light was higher than or equal to 350 mJ/cm$^2$ and lower than or equal to 400 mJ/cm$^2$, and 11.6 shots of irradiation were performed at an arbitrary point of the crystalline silicon film. Next, a semiconductor film containing a rare gas element such as Ar was formed over the crystalline silicon film with the oxide film interposed therebetween. By heat treatment, the metal element was gettered to the semiconductor film containing a rare gas element, and the metal element in the crystalline silicon film was reduced or removed. Then, the semiconductor film containing a rare gas element was removed by etching by using an alkaline solution such as TMAH, and the oxide film was subsequently removed by using a hydrofluoric acid based solution. Thereafter, the crystalline silicon film was irradiated with second laser light. Energy density of the second laser light was higher than or equal to 350 mJ/cm$^2$ and lower than or equal to 400 mJ/cm$^2$, and 5.8 shots of irradiation were performed at an arbitrary point of the crystalline silicon film. The crystalline silicon film manufactured up to here is referred to as a sample B. FIG. 22 shows a SEM photograph of the surface of the manufactured crystalline silicon film (sample B).

Then, FIG. 23 will be explained. First, an amorphous silicon film formed over an insulating substrate was doped with a metal element which promotes crystallization such as nickel and was crystallized by heat treatment. Next, an oxide film such as a natural oxide film formed over a crystallized silicon film (crystalline silicon film) was removed by using hydrofluoric acid, and immediately thereafter, the surface of the crystalline silicon film was treated with an ozone-containing aqueous solution to form a new oxide film. Then, the crystalline silicon film was irradiated with first laser light. Energy density of the first laser light was higher than or equal to 350 mJ/cm$^2$ and lower than or equal to 400 mJ/cm$^2$, and 11.6 shots of irradiation were performed at an arbitrary point of the crystalline silicon film. Next, a semiconductor film containing a rare gas element such as Ar was formed over the crystalline silicon film with the oxide film interposed therebetween. By heat treatment, the metal element was gettered to the semiconductor film containing a rare gas element, and the metal element in the crystalline silicon film was reduced or removed. Then, the semiconductor film containing a rare gas element was removed by etching by using an alkaline solution such as TMAH, and the oxide film was subsequently removed by using a hydrofluoric acid based solution. Thereafter, the crystalline silicon film was irradiated with second laser light. Energy density of the second laser light was higher than or equal to 310 mJ/cm$^2$ and lower than or equal to 360 mJ/cm$^2$, and 5.8 shots of irradiation were performed at an arbitrary point of the crystalline silicon film. The crystalline silicon film manufactured up to here is referred to as a sample C. FIG. 23 shows a SEM photograph of the surface of the manufactured crystalline silicon film (sample C).

Table 1 shows density of pin holes over each of the surfaces of the crystalline silicon film samples A, B, and C, which are manufactured under the above described conditions respectively, per unit area (1 mm$^2$). The number of pin holes was measured by counting the pin holes contained in one screen by using a SEM.

TABLE 1

| Sample name | Pin holes density (mm$^{-2}$) |
|---|---|
| A | $7.7 \times 10^4$ |
| B | 0 |
| C | 0 |

As shown in the photograph of FIG. 21, in the case where the amorphous semiconductor film is crystallized by heat treatment, the oxide film is removed, and laser light irradiation is carried out only once (in the case where the second laser light irradiation is not carried out), it is understood that there are a plurality of pin holes over the surface of the crystalline silicon film (sample A), and the surface is uneven. As shown in Table 1, density of the pin holes per unit area of the crystalline silicon film (sample A) at this time was $7.7 \times 10^4$ pieces/mm$^2$.

On the other hand, as shown in the photograph of FIG. 22, in the case where the amorphous semiconductor film is crystallized by heat treatment, the oxide film is removed and another oxide film is formed immediately thereafter, and laser light irradiation is carried out twice before and after the gettering step, it is understood that there are almost no pin holes over the surface of the crystalline silicon film (sample B), and the surface is planarized.

In addition, similarly to FIG. 22, it is understood that there are almost no pin holes over the surface of the crystalline silicon film (sample C) shown in the photograph of FIG. 23, and the surface is planarized. It is to be noted that the crystalline silicon films of the sample B and the sample C are different only in energy density of the second laser light.

Accordingly, as is apparent from FIGS. 21 to 23 and Table 1, when an amorphous silicon film is crystallized by heat treatment, an oxide film is removed and another oxide film is formed immediately thereafter, and laser light irradiation is carried out twice before and after a gettering step, pin holes over a surface of a crystalline silicon film can be reduced, and the surface can be planarized.

This application is based on Japanese Patent Application serial no. 2005-324359 filed in Japan Patent Office on Nov. 9, 2005, the entire contents of which are hereby incorporated by reference.

What is claimed is:

1. A method for manufacturing a semiconductor device, comprising the steps of:
    forming an amorphous semiconductor film over a substrate having an insulating surface;
    adding a metal element which promotes crystallization to the amorphous semiconductor film;
    forming a crystalline semiconductor film by crystallizing the amorphous semiconductor film by first heat treatment;
    removing a first oxide film which is formed on the crystalline semiconductor film in the first heat treatment;

forming a second oxide film on the crystalline semiconductor film, after removing the first oxide film;

irradiating the crystalline semiconductor film on which the second oxide film is formed with first laser light, after forming the second oxide film.

2. The method for manufacturing a semiconductor device according to claim 1, wherein irradiation with the first laser light is carried out at energy density that is higher than or equal to 350 mJ/cm$^2$ and lower than or equal to 400 mJ/cm$^2$.

3. The method for manufacturing a semiconductor device according to claim 1, wherein an interval of time between removal of the first oxide film and irradiation with the first laser light is two hours or less.

4. The method for manufacturing a semiconductor device according to claim 1, wherein one or a plurality of iron (Fe), nickel (Ni), cobalt (Go), ruthenium (Ru), rhodium (Rh), palladium (Pd), osmium (Os), iridium (Ir), platinum (Pt), copper (Cu), and gold (Au) are used as the metal element which promotes crystallization.

5. A method for manufacturing a semiconductor device, comprising the steps of:

forming an amorphous semiconductor film over a substrate having an insulating surface;

adding a metal element which promotes crystallization to the amorphous semiconductor film;

forming a crystalline semiconductor film by crystallizing the amorphous semiconductor film by first heat treatment;

removing a first oxide film which is formed on the crystalline semiconductor film in the first heat treatment;

forming a second oxide film on the crystalline semiconductor film, after removing the first oxide film;

irradiating the crystalline semiconductor film on which the second oxide film is formed with first laser light, after forming the second oxide film;

forming a semiconductor film containing a rare gas element on the second oxide film;

gettering the metal element contained in the crystalline semiconductor film to the semiconductor film containing a rare gas element by second heat treatment;

removing the semiconductor film containing a rare gas element and the second oxide film; and irradiating the crystalline semiconductor film with second laser light.

6. The method for manufacturing a semiconductor device according to claim 5, wherein irradiation with the first laser light is carried out at energy density that is higher than or equal to 350 mJ/cm$^2$ and lower than or equal to 400 mJ/cm$^2$.

7. The method for manufacturing a semiconductor device according to claim 5, wherein irradiation with the second laser light is carried out at energy density that is higher than or equal to 340 mJ/cm$^2$ and lower than or equal to 400 mJ/cm$^2$.

8. The method for manufacturing a semiconductor device according to claim 5, wherein a number of shots of the second laser light is lower than a number of shots of the first laser light.

9. The method for manufacturing a semiconductor device according to claim 5, wherein an interval of time between removal of the first oxide film and irradiation with the first laser light is two hours or less.

10. The method for manufacturing a semiconductor device according to claim 5, wherein an interval of time between irradiation with the first laser light and formation of the semiconductor film containing a rare gas element is 48 hours or less.

11. The method for manufacturing a semiconductor device according to claim 5, wherein an interval of time between removal of the second oxide film and a start of irradiation with the second laser light is two hours or less.

12. The method for manufacturing a semiconductor device according to claim 5, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

13. A method for manufacturing a semiconductor device, comprising the steps of:

forming an amorphous semiconductor film over a substrate having an insulating surface;

adding a metal element which promotes crystallization to the amorphous semiconductor film;

forming a crystalline semiconductor film by crystallizing the amorphous semiconductor film by first heat treatment;

removing a first oxide film which is formed on the crystalline semiconductor film in the first heat treatment;

forming a second oxide film on the crystalline semiconductor film, after removing the first oxide film;

irradiating the crystalline semiconductor film on which the second oxide film is formed with first laser light in an atmosphere containing oxygen, after forming the second oxide film;

forming a semiconductor film containing a rare gas element on the second oxide film;

gettering the metal element contained in the crystalline semiconductor film to the semiconductor film containing a rare gas element by second heat treatment;

removing the semiconductor film containing a rare gas element and the second oxide film; and irradiating the crystalline semiconductor film with second laser light in an atmosphere containing nitrogen or in vacuum.

14. The method for manufacturing a semiconductor device according to claim 13, wherein irradiation with the first laser light is carried out at energy density that is higher than or equal to 350 mJ/cm$^2$ and lower than or equal to 400 mJ/cm$^2$.

15. The method for manufacturing a semiconductor device according to claim 13, wherein irradiation with the second laser light is carried out at energy density that is higher than or equal to 340 mJ/cm$^2$ and lower than or equal to 400 mJ/cm$^2$.

16. The method for manufacturing a semiconductor device according to claim 13, wherein a number of shots of the second laser light is lower than a number of shots of the first laser light.

17. The method for manufacturing a semiconductor device according to claim 13, wherein an interval of time between removal of the first oxide film and irradiation with the first laser light is two hours or less.

18. The method for manufacturing a semiconductor device according to claim 13, wherein an interval of time between irradiation with the first laser light and formation of the semiconductor film containing a rare gas element is 48 hours or less.

19. The method for manufacturing a semiconductor device according to claim 13, wherein an interval of time between removal of the second oxide film and a start of irradiation with the second laser light is two hours or less.

20. The method for manufacturing a semiconductor device according to claim 13, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

21. A method for manufacturing a semiconductor device, comprising the steps of:
forming an amorphous semiconductor film over a substrate having an insulating surface;
adding a metal element which promotes crystallization to the amorphous semiconductor film;
forming a crystalline semiconductor film by crystallizing the amorphous semiconductor film by first heat treatment;
removing a first oxide film which is formed on the crystalline semiconductor film in the first heat treatment with hydrofluoric acid;
forming a second oxide film on the crystalline semiconductor film with an ozone-containing aqueous solution, after removing the first oxide film;
irradiating the crystalline semiconductor film on which the second oxide film is formed with first laser light in an atmosphere containing oxygen, after forming the second oxide film;
forming a semiconductor film containing a rare gas element on the second oxide film;
gettering the metal element contained in the crystalline semiconductor film to the semiconductor film containing a rare gas element by second heat treatment;
removing the semiconductor film containing a rare gas element and the second oxide film; and
irradiating the crystalline semiconductor film with second laser light in an atmosphere containing nitrogen or in vacuum.

22. The method for manufacturing a semiconductor device according to claim 21, wherein irradiation with the first laser light is carried out at energy density that is higher than or equal to 350 mJ/cm$^2$ and lower than or equal to 400 mJ/cm$^2$.

23. The method for manufacturing a semiconductor device according to claim 21, wherein irradiation with the second laser light is carried out at energy density that is higher than or equal to 340 mJ/cm$^2$ and lower than or equal to 400 mJ/cm$^2$.

24. The method for manufacturing a semiconductor device according to claim 21, wherein a number of shots of the second laser light is lower than a number of shots of the first laser light.

25. The method for manufacturing a semiconductor device according to claim 21, wherein an interval of time between removal of the first oxide film and irradiation with the first laser light is two hours or less.

26. The method for manufacturing a semiconductor device according to claim 21, wherein an interval of time between irradiation with the first laser light and formation of the semiconductor film containing a rare gas element is 48 hours or less.

27. The method for manufacturing a semiconductor device according to claim 21, wherein an interval of time between removal of the second oxide film and a start of irradiation with the second laser light is two hours or less.

28. The method for manufacturing a semiconductor device according to claim 21, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

29. A method for manufacturing a semiconductor device, comprising the steps of:
forming an amorphous semiconductor film over a substrate having an insulating surface;
adding a metal element which promotes crystallization to the amorphous semiconductor film;
forming a crystalline semiconductor film by crystallizing the amorphous semiconductor film by first heat treatment;
removing a first oxide film which is formed on the crystalline semiconductor film in the first heat treatment;
forming a second oxide film on the crystalline semiconductor film, after removing the first oxide film;
irradiating the crystalline semiconductor film on which the second oxide film is formed with first laser light, after forming the second oxide film;
forming a semiconductor film containing a rare gas element on the second oxide film;
gettering the metal element contained in the crystalline semiconductor film to the semiconductor film containing a rare gas element by second heat treatment;
removing the semiconductor film containing a rare gas element and the second oxide film;
irradiating the crystalline semiconductor film with second laser light;
forming an island-shaped semiconductor film by etching the crystalline semiconductor film; and
forming a gate insulating film on the island-shaped semiconductor film.

30. The method for manufacturing a semiconductor device according to claim 29, wherein irradiation with the first laser light is carried out at energy density that is higher than or equal to 350 mJ/cm$^2$ and lower than or equal to 400 mJ/cm$^2$.

31. The method for manufacturing a semiconductor device according to claim 29, wherein irradiation with the second laser light is carried out at energy density that is higher than or equal to 340 mJ/cm$^2$ and lower than or equal to 400 mJ/cm$^2$.

32. The method for manufacturing a semiconductor device according to claim 29, wherein a number of shots of the second laser light is lower than a number of shots of the first laser light.

33. The method for manufacturing a semiconductor device according to claim 29, wherein an interval of time between removal of the first oxide film and irradiation with the first laser light is two hours or less.

34. The method for manufacturing a semiconductor device according to claim 29, wherein an interval of time between irradiation with the first laser light and formation of the semiconductor film containing a rare gas element is 48 hours or less.

35. The method for manufacturing a semiconductor device according to claim 29, wherein an interval of time between removal of the second oxide film and a start of irradiation with the second laser light is two hours or less.

36. The method for manufacturing a semiconductor device according to claim 29, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

37. A method for manufacturing a semiconductor device, comprising the steps of:
forming an amorphous semiconductor film over a substrate having an insulating surface;
adding a metal element which promotes crystallization to the amorphous semiconductor film;
forming a crystalline semiconductor film by crystallizing the amorphous semiconductor film by first heat treatment;
removing a first oxide film which is formed on the crystalline semiconductor film in the first heat treatment;
forming a second oxide film on the crystalline semiconductor film, after removing the first oxide film;

irradiating the crystalline semiconductor film on which the second oxide film is formed with first laser light in an atmosphere containing oxygen, after forming the second oxide film;

forming a semiconductor film containing a rare gas element on the second oxide film;

gettering the metal element contained in the crystalline semiconductor film to the semiconductor film containing a rare gas element by second heat treatment;

removing the semiconductor film containing a rare gas element and the second oxide film;

irradiating the crystalline semiconductor film with second laser light in an atmosphere containing nitrogen or in vacuum;

forming an island-shaped semiconductor film by etching the crystalline semiconductor film; and forming a gate insulating film on the island-shaped semiconductor film.

38. The method for manufacturing a semiconductor device according to claim 37, wherein irradiation with the first laser light is carried out at energy density that is higher than or equal to 350 mJ/cm$^2$ and lower than or equal to 400 mJ/cm$^2$.

39. The method for manufacturing a semiconductor device according to claim 37, wherein irradiation with the second laser light is carried out at energy density that is higher than or equal to 340 mJ/cm$^2$ and lower than or equal to 400 mJ/cm$^2$.

40. The method for manufacturing a semiconductor device according to claim 37, wherein a number of shots of the second laser light is lower than a number of shots of the first laser light.

41. The method for manufacturing a semiconductor device according to claim 37, wherein an interval of time between removal of the first oxide film and irradiation with the first laser light is two hours or less.

42. The method for manufacturing a semiconductor device according to claim 37, wherein an interval of time between irradiation with the first laser light and formation of the semiconductor film containing a rare gas element is 48 hours or less.

43. The method for manufacturing a semiconductor device according to claim 37, wherein an interval of time between removal of the second oxide film and a start of irradiation with the second laser light is two hours or less.

44. The method for manufacturing a semiconductor device according to claim 37, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

45. A method for manufacturing a semiconductor device, comprising the steps of:

forming an amorphous semiconductor film over a substrate having an insulating surface;

adding a metal element which promotes crystallization to the amorphous semiconductor film;

forming a crystalline semiconductor film by crystallizing the amorphous semiconductor film by first heat treatment;

removing a first oxide film which is formed on the crystalline semiconductor film in the first heat treatment with hydrofluoric acids;

forming a second oxide film on the crystalline semiconductor film with an ozone-containing aqueous solution, after removing the first oxide film;

irradiating the crystalline semiconductor film on which the second oxide film is formed with first laser light in an atmosphere containing oxygen, after forming the second oxide film;

forming a semiconductor film containing a rare gas element on the second oxide film;

gettering the metal element contained in the crystalline semiconductor film to the semiconductor film containing a rare gas element by second heat treatment;

removing the semiconductor film containing a rare gas element and the second oxide film;

irradiating the crystalline semiconductor film with second laser light in an atmosphere containing nitrogen or in vacuum;

forming an island-shaped semiconductor film by etching the crystalline semiconductor film; and forming a gate insulating film on the island-shaped semiconductor film.

46. The method for manufacturing a semiconductor device according to claim 45, wherein irradiation with the first laser light is carried out at energy density that is higher than or equal to 350 mJ/cm$^2$ and lower than or equal to 400 mJ/cm$^2$.

47. The method for manufacturing a semiconductor device according to claim 45, wherein irradiation with the second laser light is carried out at energy density that is higher than or equal to 340 mJ/cm$^2$ and lower than or equal to 400 mJ/cm$^2$.

48. The method for manufacturing a semiconductor device according to claim 45, wherein a number of shots of the second laser light is lower than a number of shots of the first laser light.

49. The method for manufacturing a semiconductor device according to claim 45, wherein an interval of time between removal of the first oxide film and irradiation with the first laser light is two hours or less.

50. The method for manufacturing a semiconductor device according to claim 45, wherein an interval of time between irradiation with the first laser light and formation of the semiconductor film containing a rare gas element is 48 hours or less.

51. The method for manufacturing a semiconductor device according to claim 45, wherein an interval of time between removal of the second oxide film and a start of irradiation with the second laser light is two hours or less.

52. The method for manufacturing a semiconductor device according to claim 45, wherein one or a plurality of iron (Fe), nickel (Ni), cobalt (Co), ruthenium (Ru), rhodium (Rh), palladium (Pd), osmium (Os), iridium (Ir), platinum (Pt), copper (Cu), and gold (Au) are used as the metal element which promotes crystallization.

* * * * *